United States Patent [19]

Hamade et al.

[11] Patent Number: 5,650,975
[45] Date of Patent: Jul. 22, 1997

[54] SEMICONDUCTOR MEMORY DEVICE HAVING IMPROVED HIERARCHICAL I/O LINE PAIR STRUCTURE

[75] Inventors: Kei Hamade; Kenichi Yasuda; Mikio Asakura; Hideto Hidaka, all of Hyogo, Japan

[73] Assignee: Mitsubishi Denki Kabushiki Kaisha, Tokyo, Japan

[21] Appl. No.: 710,109

[22] Filed: Sep. 12, 1996

[30] Foreign Application Priority Data

Sep. 14, 1995 [JP] Japan .................................. 7-236891
Nov. 28, 1995 [JP] Japan .................................. 7-309577

[51] Int. Cl.$^6$ ................................................ G11C 13/00
[52] U.S. Cl. .............. 365/230.01; 365/222; 365/230.06
[58] Field of Search ......................... 365/189.01, 189.03, 365/189.05, 189.11, 222, 202, 230.01, 230.03, 230.06, 233, 226

[56] References Cited

U.S. PATENT DOCUMENTS 5,040,144  8/1991  Pelley et al. ........................ 365/226
5,097,440  3/1992  Konishi et al. .
5,184,321  2/1993  Konishi et al. .
5,321,646  6/1994  Tomishima et al. .
5,325,336  6/1994  Tomishima et al. .

OTHER PUBLICATIONS

"A 64Mb DRAM with Meshed Power Line and Distributed Sense–Amplifier Driver", T. Yamada et al., 1991 IEEE International Solid–State Circuits Conference, pp. 108–109.
"A 40ns 64Mb DRAM with Current–Sensing Data–Bus Amplifier", M. Taguchi et al., 1991 IEEE International Solid–State Circuits Conference, pp. 112–113.

Primary Examiner—Terrell W. Fears
Attorney, Agent, or Firm—Lowe, Price, LeBlanc & Becker

[57] ABSTRACT

In a memory plane of a semiconductor memory device, transmission gate circuits for transferring data between local I/O line pair and global I/O line pair, and equalizing circuits for equalizing the local I/O line pair are arranged alternately on both sides of a shunt region. All the global I/O line pairs extend entirely over the memory plane. One and the other global I/O lines are arranged in symmetry, with a line for transmitting bit line precharge voltage, cell plate voltage or local input/output line equalizing signal being the center.

8 Claims, 32 Drawing Sheets

SEMICONDUCTOR MEMORY DEVICE HAVING IMPROVED HIERARCHICAL I/O LINE PAIR STRUCTURE

BACKGROUND OF THE INVENTION

1. Field of the Invention

The present invention relates to a semiconductor memory device and, more specifically, to a layout of a semiconductor memory device having a hierarchical input/output (I/O) line pair structure.

2. Description of the Background Art

In semiconductor memory devices, chip areas have been increased to ensure larger capacity. However, when the chip area increases to ensure larger capacity, signal lines are extended longer, resulting in signal propagation delay, causing delay in access time, degrading electrical property, and causing increased operational current and standby current.

Generally, in order to suppress operational current, a memory block included in the semiconductor memory device is divided, and divided blocks are operated separately. However, if the number of division increases the chip area also increases, and therefore, this approach has its limit. Meanwhile, as the device comes to be miniaturized, difficulty in processing comes to be more severe. Micro short-circuit in a memory cell caused by unsuccessful processing has become a cause increasing the standby current.

SUMMARY OF THE INVENTION

An object of the present invention is to reduce layout area of a memory cell array and to enlarge process margin.

According to one aspect, the semiconductor memory device includes a plurality of first memory blocks arranged in a column direction. Each of the first memory blocks includes four second memory blocks, a plurality of word lines, four shunt regions, four column selection gates, four local I/O line pairs and four global I/O line pairs. The four second memory blocks are arranged in the column direction. The plurality of word lines are arranged in the row direction, traversing the four second memory blocks. The four shunt regions and four second memory blocks are arranged alternately, and the shunt regions shunt the plurality of word lines. Four column selecting gates are arranged in column direction. Each column selecting gate traverses corresponding one of the shunt region. Four local I/O line pairs are arranged two by two on both sides of the second memory block in the row direction. The four local I/O line pairs are arranged in the column direction. Each of the global I/O line pairs traverses corresponding one of the shunt regions. Each of the second memory blocks includes four bit line pairs, a plurality of memory cells, four P channel sense amplifiers, four N channel sense amplifiers and four column selecting gates. The four bit line pairs are arranged in the column direction, crossing the plurality of word lines. The plurality of memory cells are arranged at crossing points of the plurality of word lines and four bit line pairs. The four P channel sense amplifiers are connected to corresponding one of the bit line pairs. The four N channel sense amplifiers are connected to corresponding one of the bit line pairs. The four column selecting gates turn on in response to corresponding one of the column selecting line. Each of the column selecting gates is connected between the corresponding one of the bit line pairs and corresponding one of the local I/O line pairs. Each of the first memory blocks further includes four transmission gates and four equalizing circuits. The four transmission gates are arranged two by two on both sides of the four shunt regions. Each of the transmission gates is connected to the corresponding one of the local I/O line pairs, and the corresponding one of the global I/O lines. The four equalizing circuits are arranged two by two on both sides of the four shunt regions, and equalize the voltages of the four local I/O line pairs. Each of the equalizing circuits is arranged on that side of the shunt region which is opposite to the side where the corresponding one of the transmission gate is arranged.

As described above, since the equalizing circuits are arranged on both sides of the shunt regions alternately with the transmission gates, increase in the area occupied by the equalizing circuits can be prevented.

According to another aspect of the present invention, the semiconductor memory device includes first and second base blocks, four first global I/O line pairs and four second global I/O lines. The first and second base blocks are arranged in the row direction. The four first global I/O line pairs are arranged in the column direction, traversing the first and second base blocks. The four second global I/O line pairs are arranged in the column direction, traversing the first and second base blocks, and each of the second global I/O line pairs extends along the corresponding one of the first global I/O line pairs. The first base blocks include four first memory blocks, a plurality of first word lines, four first local I/O line pairs and four first transmission gates. The four first memory blocks are arranged in the column direction. The plurality of first word lines are arranged in the row direction, traversing the four first memory blocks. The four first local I/O line pairs are arranged in the row direction. Each of the four first transmission gates is connected to the corresponding one of the first local I/O line pairs and the corresponding one of the first global I/O lines. Each of the first memory blocks includes four first bit line pairs, a plurality of first memory cells and four first column selecting gates. The four first bit line pairs are arranged in the column direction, crossing the plurality of first word lines. The plurality of first memory cells are arranged at cross points of the plurality of first word lines and the four first bit line pairs. Each of the first column selecting gates is connected between the corresponding one of the first bit line pairs and the corresponding one of the first local I/O line pairs. The second base block includes four second memory blocks, a plurality of second word lines, four second local I/O line pairs and four second transmission gates. The four second memory blocks are arranged in the column direction. The plurality of the second word lines are arranged in the row direction, traversing the four second memory blocks. The four second local I/O line pairs are arranged in the row direction. Each of the second transmission gates is connected between the corresponding one of the second local I/O line pairs and the corresponding one of the second global I/O lines. Each of the second memory blocks includes four second bit line pairs, a plurality of second memory cells and four second column selecting gates. The four second bit line pairs are arranged in a column direction, crossing the plurality of second word lines. The plurality of second memory cells are arranged at cross points of the plurality of second word lines and four second bit line pairs. Each of the second column selecting gates is connected between corresponding one of the second bit line pairs and the corresponding one of the second local I/O line pairs.

As described above, not only the second global I/O line pairs, but the first global I/O line pairs traverse the first and second base blocks, so that data transfer characteristic of the first global I/O line pairs is the same as that of the second global I/O line pairs.

According to a still further aspect of the present invention, the semiconductor memory device includes a plurality of first word lines, a first bit line pair, a plurality of first memory cells, a first local I/O line pair, a first column selecting gate, a first global I/O line pair, a first transmission gate, a plurality of second word lines, a second bit line pair, a plurality of second memory cells, a second local I/O line pair, a second column selecting gate, a second global I/O line pair, a second transmission gate and a prescribed line. The plurality of first word lines are arranged in the row direction. The first bit line pair crosses the plurality of first word lines. The plurality of first memory cells are arranged at cross points of the plurality of first word lines and the first bit line pair. The first local I/O line pair corresponds to the first bit line pair. The first column selecting gate is connected between the first bit line pair and the first local I/O line pair. The first global I/O line pair corresponds to the first local I/O line pair. The first transmission gate is connected between the first local I/O line pair and a first global I/O line pair. The plurality of second word lines are arranged in the row direction. The second bit line pair crosses the plurality of second word lines. The plurality of second memory cells are arranged at cross points of the plurality of second word lines and the second bit line pair. The second local I/O line pair corresponds to the second bit line pair. The second column selecting gate is connected between the second bit line pair and the second local I/O line pair. The second global I/O line corresponds to the second local I/O line pair, and it extends along the first global I/O line pair. The second transmission gate is connected with the second local I/O line pair and the second global I/O line pair. The prescribed line extends along the first and second global I/O line pairs. One and the other of the global I/O lines of the first global I/O line pair are arranged on both sides of the prescribed line. One and the other global I/O lines of the second global I/O line pair are arranged on both sides of the first global I/O line pair.

As described above, since the first and second first global I/O line pairs are arranged in symmetry with respect to the prescribed line, the first global I/O line pair has the same transfer characteristics as that of the second global I/O line pair.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to figures.

[First Embodiment]

Figure 1:
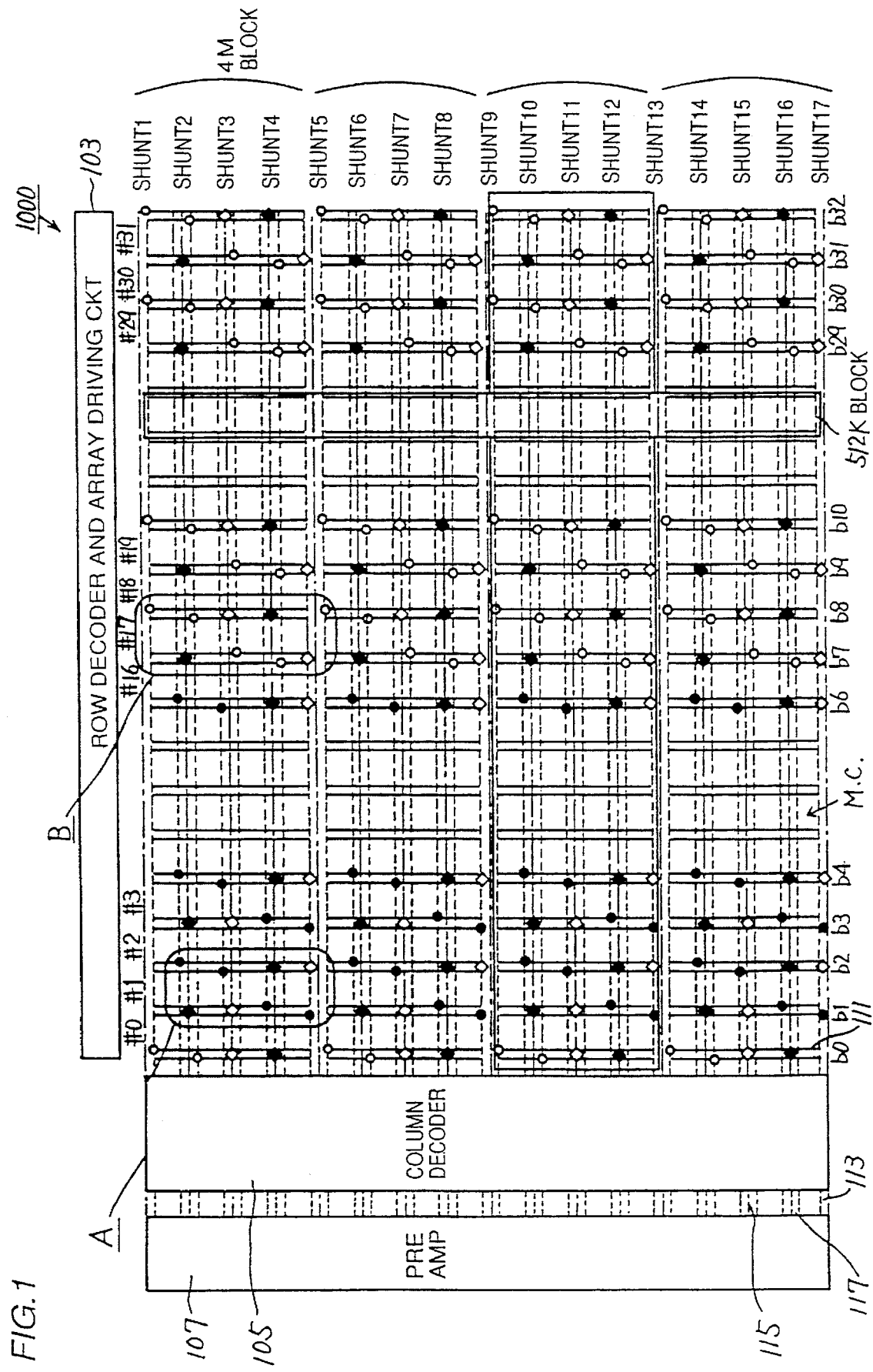
FIG. 1 schematically shows one memory cell array of the semiconductor memory device in accordance with a first embodiment of the present invention.

A 64M bit dynamic random access memory (DRAM) in accordance with a first embodiment has four memory planes 1000 such as shown in FIG. 1. Each memory plane 1000 has a memory array of 16M bits.

Referring to FIG. 1, each memory plane 1000 includes 33 sense amplifier block portions b0 to b32 arranged in the row direction, 17 shunt regions shunt 1 to shunt 17 arranged in the column direction for shunting word lines, 512 bit sub memory cell blocks M.C. of 32K each, divided by sense amplifier block portions b0 to b32 and shunt regions shunt 1 to shunt 17, a row decoder and array driving circuit 103, a column decoder 105 and a preamplifier 107.

Two local I/O line pairs 111 are arranged in each of the sense amplifier block portions b0 to b32. Two global I/O line pairs 113 are arranged in each of the shunt regions shunt 1 to shunt 17. A $V_{BL}$ line or $V_{CP}$ line to which a bit line precharge voltage $V_{BL}$ or a cell plate voltage $V_{CP}$ is supplied is arranged in the middle of the two global I/O line pairs 113. There are a plurality of transmission gate circuits represented by ● at cross points between local I/O line pair 111 and global I/O line pair 113. At cross points of local I/O line pair 111 and global I/O line pair, precharge/equalizing circuits represented by ◇ for precharging and equalizing the local I/O line pair 111 and a sense amplifier driving line pair, and an equalizing circuit represented by ♦ for equalizing local I/O line pair 111 are arranged.

Referring to FIG. 1, memory plane 1000 is divided into 32 blocks #0 to #31 of 512K each, by sense amplifier block portions b0 to b32, and further divided to 16 blocks of 1M by shunt regions shunt 1 to shunt 17. Namely, memory plane 1000 is divided into 512 (=32×16) sub memory cell blocks M.C. each of 32K.

The operation of such memory cell array is divided block by block, that is, blocks #0 to #31 operate independent from each other. In a 8K refreshing operation, only an array driving circuit 103 which corresponds to any of blocks #0 to #31 is activated, and only that block operates. In a 4K refreshing operation, array driving circuits 103 corresponding to one of the blocks #0 to #15 and to corresponding one of the blocks #16 to #31, that is, corresponding to a total of two blocks are activated simultaneously, and only these blocks operate.

The transmission gate circuits, the precharge/equalizing circuits, and the equalizing circuits are arranged at cross points between sense amplifier block portions b0 to b32 and shunt regions shunt 1 to shunt 17.

All the local I/O line pairs 111 in the blocks #0 to #15 of the left side of the figure are connected to the global I/O line pairs 113 on the upper side of the figure through the transmission gate circuits denoted by black circles (●). On the other hand, all the local I/O line pairs 111 of the blocks #16 to #31 on the right side of the figure are connected to the global I/O line pairs 113 on the lower side of the figure through the transmission gate circuits represented by circles (○). Since the data of the global I/O line pairs 113 are read to the left side of the figure, the global I/O line pairs 113 on the upper side of the figure in blocks #16 to #31 on the right side of the figure are, in principle, not necessary, though they are provided in this embodiment, because, if the global I/O lines 113 has different lengths, global I/O line pairs 113 comes to have different parasitic capacitances, which results in different data transfer characteristics.

Figure 2:
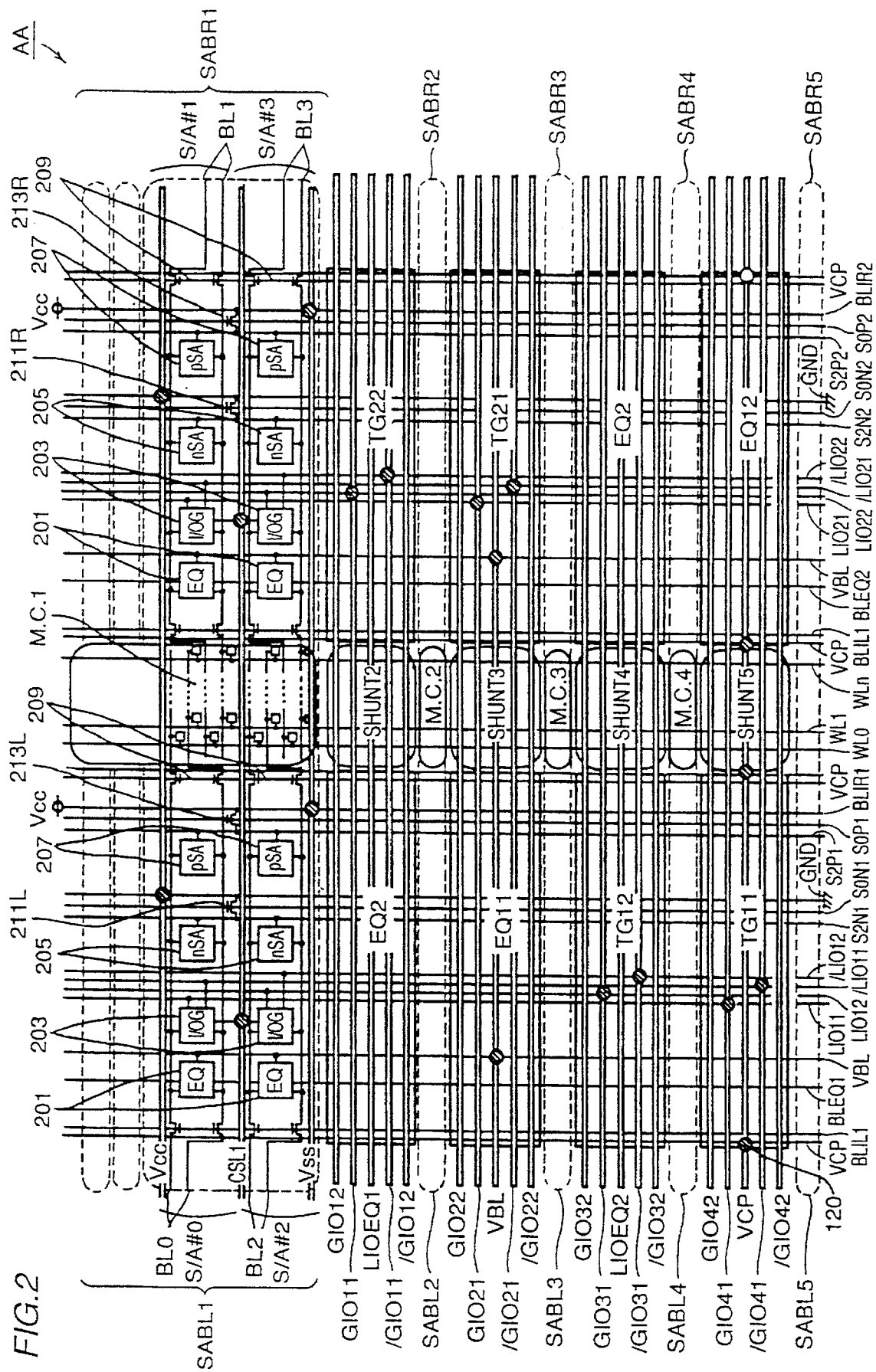
FIG. 2 shows, in detail, a structure of a base block AA of FIG. 1.

Referring to FIG. 2, the base block AA includes sub memory cell blocks M.C.1–M.C.4, shunt regions shunt 2 to shunt 5 and sense amplifier blocks SABL1–SABL4 and SABR1– SABR4 on both sides of sub memory blocks M.C.1–M.C.4.

Referring to FIG. 2, sub memory blocks M.C.1–M.C.4 and shunt region shunt 2-shunt 5 are arranged alternately. On the left side of sub memory cell blocks M.C.1–M.C.4, sense amplifier blocks SABL1–SABL4 are arranged, and on the right side, sense amplifier blocks SABR1–SABR4 are arranged.

On the left side of shunt region shunt 2 equalizing circuit EQ2 is arranged, and on the right side, transmission gate circuit TG22 is arranged. On the left side of shunt region shunt 3, precharge/equalizing circuit EQ11 is arranged, and on the right side, transmission gate circuit TQ21 is arranged. On the left side of shunt region shunt 4, transmission gate circuit TG12 is arranged, and on the right side, equalizing circuit EQ2 is arranged. On the left side of shunt region shunt 5, transmission gate circuit TG11 is arranged and on the right side, precharge/equalizing circuit EQ12 is arranged.

Word lines WL0–WLn are arranged across sub memory cell blocks M.C.1–M.C.4. Each of the sub memory cell blocks M.C.1–M.C.4 includes two bit line pairs BL0, BL2 connected to corresponding one of the sense amplifier blocks SABL1–4 on the left side and two bit line pairs BL1, BL3 connected to the corresponding one of sense amplifier blocks SABR1–4 on the right side.

Across sense amplifier blocks SABL1 to SABL4 and shunt regions shunt 2-shunt 5, there are arranged two local I/O line pairs LIO11, /LIO11 and LIO12, /LIO12; sense amplifier driving lines S0N1 and S2N1 though which a sense amplifier activating signal for the n channel sense amplifiers (nSA) is transmitted; sense amplifier driving lines S0P1 and S2P1 through which a sense amplifier activating signal for p channel sense amplifiers (pSA) is transmitted; a signal line BLEQ1 through which a bit line equalizing signal BLEQ for equalizing the bit line pair is transmitted; two $V_{CP}$ lines for supplying the cell plate voltage $V_{CP}$; a $V_{BL}$ line for supplying the bit line precharge voltage $V_{BL}$; a Vcc line for supplying the power supply voltage Vcc; a GND line for supplying the ground voltage; and selecting lines BLIR1 and BLIL1 for controlling a shared gate 209.

Local I/O line pairs LIO11, /LIO11 and LIO12, /LIO12 are divided corresponding to the 4M blocks shown in FIG. 1. However, sense amplifier driving lines S0N1, S0P1, S2N1 and S2P1 are not divided but extended over four 4M blocks shown in FIG. 1.

Similarly, across sense amplifier blocks SABR1-SABR4 and shunt regions shunt 2-shunt 5, there are provided: two local I/O line pairs LIO21, /LIO21 and LIO22, /LIO22; sense amplifier driving lines S0N2 and S2N2 through which a sense amplifier activating signal for the n channel sense amplifiers (nSA) is transmitted; sense amplifier driving lines S0P2 and S2P2 through which a sense amplifier activating signal for the p channel sense amplifiers (pSA) is transmitted; a signal line BLEQ2 through which a bit line equalizing signal BLEQ is transmitted; two $V_{CP}$ lines for supplying the cell plate voltage $V_{CP}$; the $V_{BL}$ line for supplying the bit line precharge voltage $V_{BL}$; the Vcc line for supplying the power supply voltage Vcc; the GND line for supplying the ground voltage; and selecting lines VLIL2 and BLIR2 for controlling shared gate 209.

Local I/O line pairs LIO21, /LIO21 and LIO22, /LIO22 are divided corresponding to 4M blocks shown in FIG. 1. However, sense amplifier driving lines S0N2, S0P2, S2N2 and S2P2 are not divided but extended over four 4M blocks shown in FIG. 1.

As described above, since sense amplifier driving lines S0N1, S0N2, S0P1, S0P2, S2N1, S2N2, S2P1 and S2P2 extend over four 4M blocks, they have large parasitic capacitances. Therefore, sense amplifiers are not susceptible to the influence of noise and they operate stably. Further, since four equalizing circuits are connected to one sense amplifier driving line, delay in the speed of operation can be suppressed.

Figure 3:
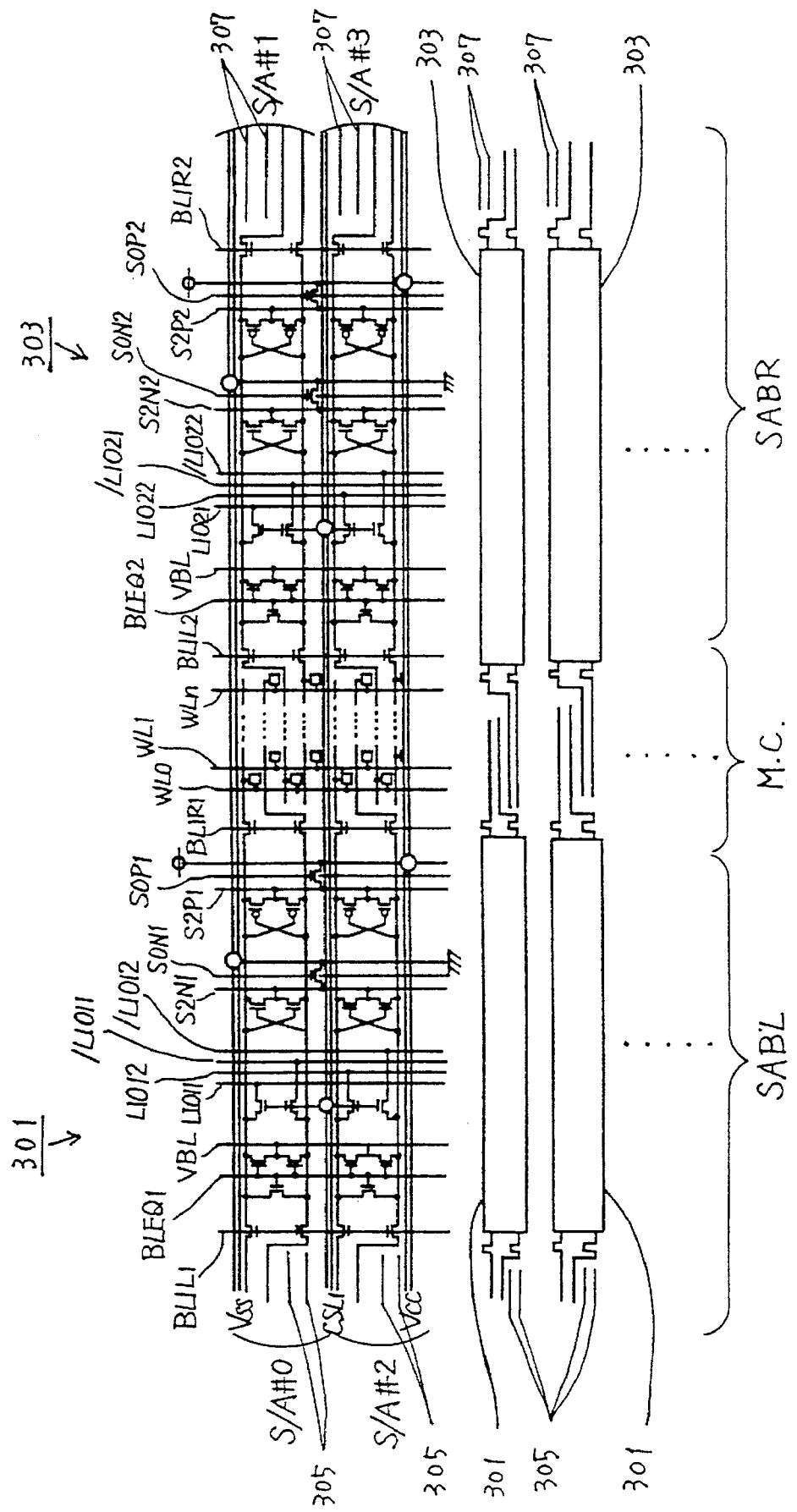
FIG. 3 is a circuit diagram showing the detail of the memory cell block and sense amplifier block on both sides thereof, shown in FIG. 2.

Bit line pair BL0 is arranged in a sense amplifier band S/A#0, bit line pair BL1 is arranged in sense amplifier band S/A#1, bit line pair BL2 in sense amplifier band S/A#2 and bit line pair BL3 in sense amplifier band S/A#3. More specifically, even numbered bit line pairs are connected to the sense amplifier band on the left side, while odd numbered bit line pairs are connected to the sense amplifier band on the right side. FIG. 3 shows a unit of such repetition of alternate arrangement. Each of the sense amplifier bands S/A#0–S/A#3 includes a precharge/equalizing circuit (EQ) 201 for precharging and equalizing the corresponding bit line pair, an I/O gate (I/OG) 203 for connecting the corresponding bit line pair to the corresponding local I/O line pair, an n channel sense amplifier (nSA) 205, a p channel sense amplifier (pSA) 207 and a shared gate 209. Shared gate 209 connects a memory cell in sub memory cell block M.C. to each of the circuits in sense amplifier band S/A#0.

In sense amplifier block SABL1, I/O gate (I/OG) 203 is connected to column selecting line CSL1. A driving transistor 211L for the n channel sense amplifier is connected between sense amplifier driving line S2N1 and GND line, with its gate electrode connected to sense amplifier driving line S0N1. A driving transistor 213L for the p channel sense amplifier is connected between sense amplifier driving line S2P1 and the Vcc line with its gate electrode connected to sense amplifier driving line S0P1.

In each of the sense amplifier bands S/A#0 and S/A#2 included in sense amplifier block SABL1, precharge/equalizing circuit (EQ) 201 is connected to signal line BLEQ1 and $V_{BL}$ line, n channel sense amplifier (nSA) 205 is connected to sense amplifier driving line S2N1, and p channel sense amplifier (pSA) 207 is connected to sense amplifier driving line S2P1.

In sense amplifier band S/A#0, I/O gate (I/OG) 203 is connected to local I/O line pair LIO11, /LIO11, and in sense amplifier band S/A#2, I/O gate I/OG 203 is connected to local I/O line pair LIO12, /LIO12.

Sense amplifier blocks SABL2 to SABL4 also have the similar structure as sense amplifier block SABL1 described above.

In sense amplifier block SABR1, I/O gate (I/OG) 203 is connected to column selecting line CSL1. Driving transistor 211R for the n channel sense amplifiers is connected between sense amplifier driving line S2N2 and GND line, with its gate electrode connected to sense amplifier driving line S0N2. Driving transistor 213R for p channel sense amplifier is connected between sense amplifier driving line S2P2 and GND line, with its gate electrodes connected to sense amplifier driving line S0P2.

In each of the sense amplifier lines S/A#1 and S/A#3 included in sense amplifier blocks SABR1, precharge/equalizing circuit (EQ) 201 is connected between signal line BLEQ2 and $V_{BL}$ line, n channel sense amplifier (nSA) 205 is connected to sense amplifier driving line S2N2, and p channel sense amplifier (pSA) 207 is connected to sense amplifier driving line S2P2.

In sense amplifier band S/A#1, I/O gate (I/OG) 203 is connected to local I/O line pair LIO21, /LIO21, and in sense amplifier band S/A#3, I/O gate (I/OG) 203 is connected to local I/O line pair LIO22, /LIO22.

Sense amplifier blocks SABR2 to SABR4 also have the similar structure as the sense amplifier block SABR1 described above.

As described above, the sense amplifier band shown in FIG. 2 has a shared sense amplifier structure. One set of shared sense amplifiers are arranged at a pitch twice that of the bit line pair. However, these may be arranged with any pitch. Though driving transistors 211L, 211R, 213L and 213R are arranged with a pitch twice that of the sense amplifier, these may also be arranged with any pitch.

Referring to FIG. 3, the alternately arranged type sense amplifiers, the base block 301 including sense amplifier bands S/A#0 and S/A#2 in sense amplifier block SABL and base block 303 including sense amplifier bands S/A#1 and S/A#3 in sense amplifier block SABR constitute a unit of repetition.

Bit line pair 305 is connected to a further sense amplifier band on the left side, not shown, and bit line pair 302 is connected to a further sense amplifier band on the right side, not shown.

Referring to FIGS. 2 and 3, across the memory cell block M.C. and sense amplifier blocks SABL and SABR on both sides thereof, there is arranged column selecting line CSL1 between sense amplifier bands S/A#0, S/A#1 and sense amplifier bands S/A#2, S/A#3. To column selecting line CSL1, a column selecting signal output from column decoder 105 is transmitted. Column selecting lines CSL1 are arranged at a pitch twice of that of the bit line pair. The column selecting signal is applied to the I/O gate (I/OG) 203 via a through hole. Four bit line pairs BL0–BL3 are connected to four local I/O line pairs LIO011, /LIO11, /LIO12, LIO12, /LIO21, LIO21, /LIO21, LIO22 and /LIO22 through four I/O gates (I/OG) 203, respectively. Namely by one column selecting line, two I/O gates on the left and right of one sub memory block are turned on, that is, a total of four I/O gates are turned on simultaneously, and 4 bits of data are output in parallel through four local I/O line pairs.

On the memory cell array, in addition to the column selecting line CSL1, there are Vcc and Vss (GND) lines for reinforcing power supply exclusively for the array circuit arranged approximately parallel to the bit lines, in the same layer as column selecting lines CSL1.

Figure 4:
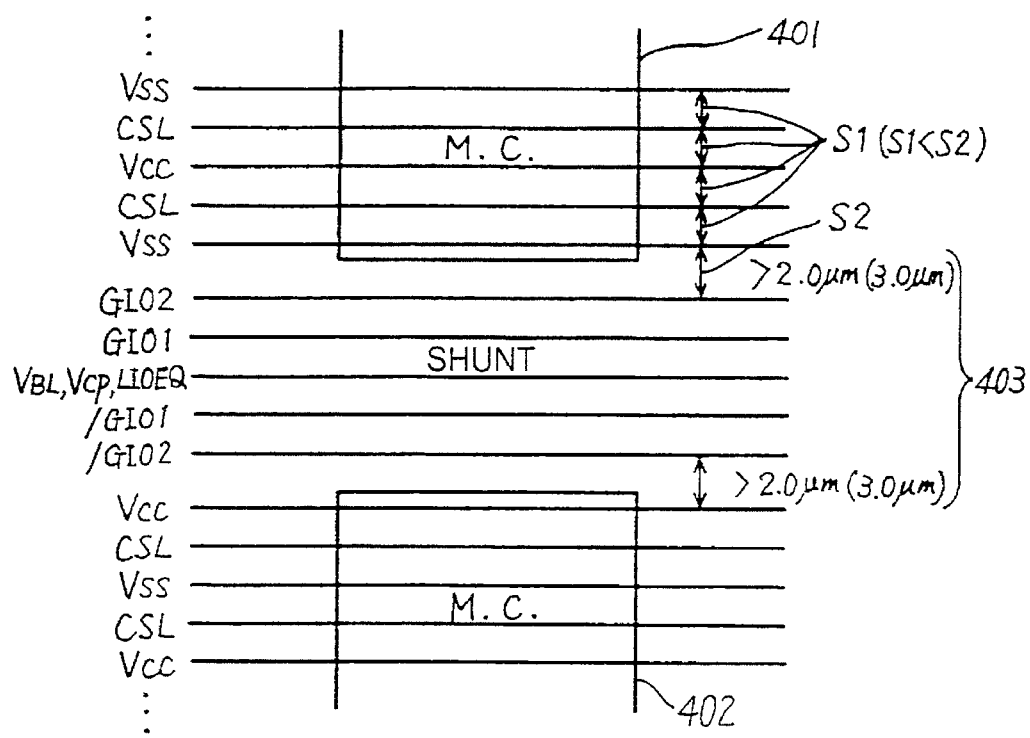
FIG. 4 shows end portions of adjacent memory blocks shown in FIG. 1 and lines in a shunt region between the memory cell blocks.

Referring to FIG. 4, column selecting lines CSL, Vcc line, and Vss line are arranged over adjacent memory cell blocks 401 and 402. In a shunt region 403 between memory cell blocks 401 and 402, a prescribed voltage line $V_{BL}$ line, $V_{CP}$ line or LIOEQ line, as well as two global I/O line pairs GIO1, /GIO1 and GIO2, /GIO2 are arranged.

As shown in FIGS. 2 to 4, Vcc and Vss lines are arranged alternately along the ends of memory cell clocks (M.C.) 401 and 402 between the column selecting lines CSL (CSL1). More specifically, these lines are arranged in the order of Vss line, CSL, Vcc line, Vss line, CSL, Vcc lines . . . with a pitch (S1) equal to the width (width of two bit line pairs) of the sense amplifier block. In any sub memory block, at the end of the sub memory blocks, there is arranged the Vss line or the Vcc line. Vcc and Vss lines are connected to the Vcc and Vss lines extending in parallel in the same layer as local I/O line pair, via through holes.

This relaxes the pitch of the column selecting lines, facilitating processing, and improves production yield. Further, as the power supply is reinforced, high speed and stable operation of the array circuits is realized. Further, the column selecting lines, Vcc lines and Vss lines are arranged in symmetry with respect to the sense amplifier, so that these have the same power supply resistance with respect to all the sense amplifiers. More specifically, the Vcc and Vss lines are arranged such that the positional relation of the through holes for connecting sense amplifiers are uniform, avoiding formation of a worst point.

Further, an end portion of a memory cell blocks is difficult to process, since there is inevitably a level difference between memory cell block and the shunt region. Therefore, in order to avoid short-circuit between the Vcc line or Vss line arranged at the endmost portion of the memory cell block and global I/O lines GIO2 and /GIO2 arranged at the endmost position of shunt region 403, there is ensured a space (S2) larger than the space (S1) on the memory cell. For example, when S1 is about 3 μm, the space S2 is about 4 to 5 μm.

Figure 5:
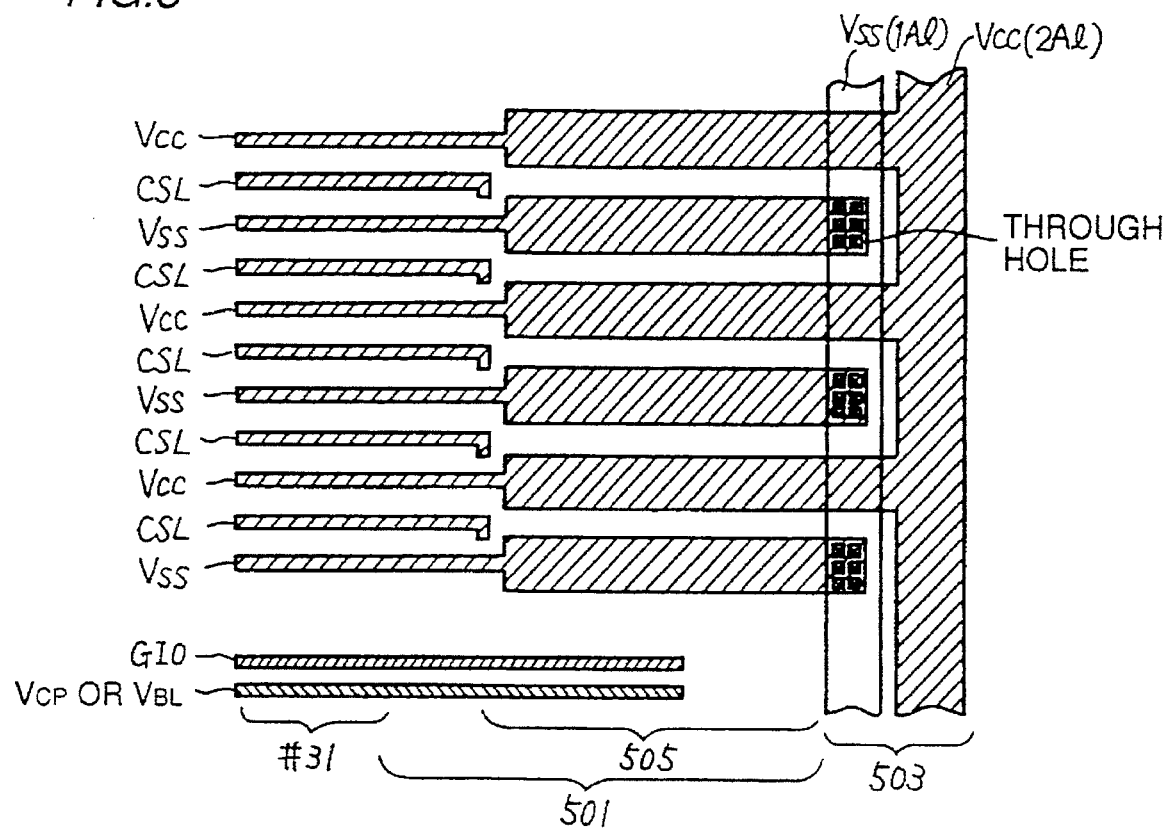
FIG. 5 is a plan view of lines Vcc and Vss shown in FIG. 1 at an end portion of the array.

Referring to FIG. 5, from the memory cell block #31, Vcc line, Vss line and column selecting line CSL are extended from memory cell block #31 in the row direction, Vcc and Vss lines are widened near the end portion 505 of sense amplifier block 501, and these are connected to a main line 503 extending near the chip.

Again referring to FIG. 2, over shunt regions shunt 2 to shunt 5, two global I/O line pairs GIO and a prescribed voltage line supplying a prescribed voltage (signal line LIOEQ1 or LIOEQ2 transmitting a local I/O line equalizing signal LIOEQ, $V_{BL}$ line or $V_{CP}$ line) are provided from one end to the other end, approximately parallel to each other.

In shunt region shunt 2, paired global I/O lines GIO11, /GIO11 are arranged in line symmetry with signal line LIOEQ1 transmitting the signal LIOEQ for equalizing the local I/O line pair, which is one of the prescribed voltage lines, and paired global I/O lines GIO12, /GIO12 are further provided on the outer side, also in line symmetry with the signal line LIOEQ1.

In shunt region shunt 3, paired global I/O lines GIO21, /GIO21 are provided on outer sides, and paired global I/O lines GIO22, /GIO22 are provided further outside, all in line symmetry, with respect to the $V_{BL}$ line for supplying the bit line precharge voltage $V_{CP}$, which is one of the prescribed voltage lines.

In shunt region shunt 4, paired global I/O lines GIO31, /GIO31 are provided on outer side, paired global I/O lines GIO32, /GIO32 are provided further outside, all in line symmetry with respect to the signal line LIOEQ2 at the center, which signal line is for transmitting the signal LIOEQ for equalizing the local I/O line pair, which is one of the prescribed voltage lines.

In shunt region shunt 5, paired global I/O lines GIO41, /GIO41 are arranged and on outer sides, paired global I/O lines GIO42, /GIO42 are provided, all in line symmetry with respect to Vcc line at the center, for supplying the cell plate voltage $V_{CP}$, which is one of the prescribed voltage lines.

In shunt regions shunt 3, $V_{BL}$ line is connected, via a through hole, to the $V_{BL}$ line connected to precharge/equalizing circuit E. In shunt region shunt 5, the $V_{CP}$ line is connected, via through hole, the $V_{CP}$ line connected to the gate electrode of sense amplifier shared gate 209. Here, in shunt regions shunt 2 to shunt 5, regions on the left of memory cell block M.C.1–M.C.4 will be referred to as shunt 2L-shunt 5L, and regions on the right side will be referred to as shunt 2R-shunt 5R, respectively.

In order to connect local I/O line pairs LIO11, LIO12, /LIO12, LIO21, /LIO21 and LIO22, /LIO22 to corresponding global I/O line pairs GIO11, /GIO11, GIO21, /GIO21, GIO31, /GIO31 and GO, /GO, transmission gate circuits TG11 and TG12 should be arranged in two of the shunt regions shunt 2L to shunt 5L, one in each region, and transmission gate circuits TG21, TG22 should be arranged, one in each of the remaining two regions where transmission gate circuits TG11 and TG12 are not formed, on the opposite side.

In the example shown in FIG. 2, transmission gate TG11 for connecting local I/O line pair LIO11, /LIO11 to global I/O line pair GO, /GO is arranged in shunt region shunt 5L; transmission gate TG12 for connecting local I/O line pair LIO12, /LOI12 to global I/O line pair GIOO31, /GIO31 is arranged in shunt region shunt 4L; transmission gate TG21 for connecting local I/O line pair LIO21, /LIO21 to global I/O line pair GIO21, /GIO21 is arranged in shunt region shunt 3R; and transmission gate TG22 for connecting local I/O line pair LIO22, /LIO22 to global I/O line pair GIO11, /GIO11 is arranged in shunt region shunt 2R.

Global I/O line pairs GIO12, /GIO12, GIO22, /GIO22, GIO32, /GIO32, GO and /GO are connected to corresponding local I/O line pairs in base block BB which will be described later, and these are not connected in base block AA.

Further, in respective shunt region, on the side opposite to the side where transmission gate TG11, TG12 or TG22 is arranged, there are arranged the precharge/equalizing circuit EQ12 for precharging and equalizing the two local I/O line pairs LIO21, /LIO21 and LIO22, /LIO22 and sense amplifier driving lines S2N2 and S2P2 to the $V_{BL}$ level; equalizing circuit EQ22 for equalizing two local I/O line pairs LIO21, /LIO21 and LIO22, /LIO22; the precharge/equalizing circuit EQ1 for precharging and equalizing the two local I/O line pairs LIO11, /LIO11 and LIO12, /LIO12 and sense amplifier driving lines S2N1 and S2P1 to the $V_{BL}$ level; and the equalizing circuit EQ21 for equalizing the two local I/O line pairs LIO11, /LIO11 and LIO12, /LIO12, respectively.

Figure 6:
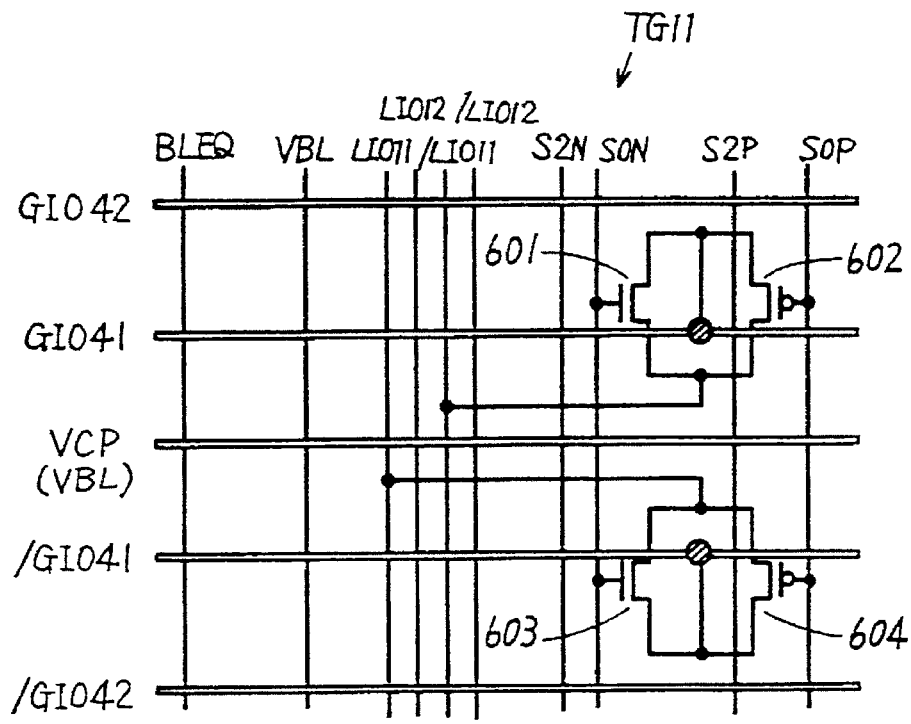
FIG. 6 shows a specific example of a transmission gate circuit shown in FIG. 2.

Referring to FIG. 6, in transmission gate circuit TG11, the data transmitted to local I/O line pair LIO11, /LIO11 are transmitted to global I/O line pair GO, /GO when the sense amplifier activating signal S0N1 is at an H (logic high) level and sense amplifier activating signal S0P1 is at an L (logic low) level, respectively.

Transmission gate TG21 has similar circuit structure as the above described transmission gate circuit TG11, and data transmitted to local I/O line pair LIO21, /LIO21 are transmitted to global I/O line pair GIO21, /GIO21 when sense amplifier activating signal S0N1 is at the H level and the sense amplifier activating signal S0P1 is at the L level, respectively.

Figure 7:
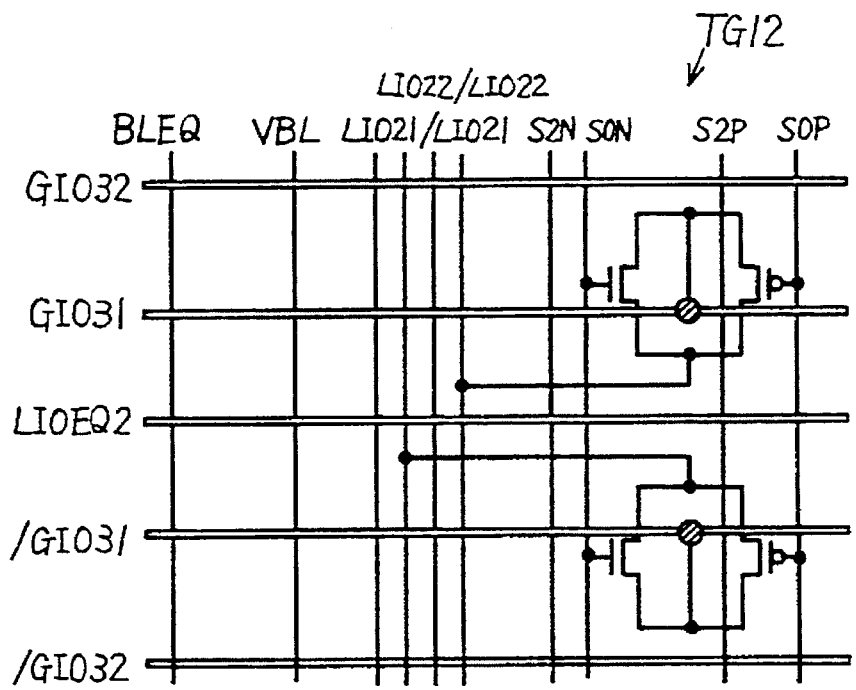
FIG. 7 shows a specific example the transmission gate circuit of FIG. 2.

Referring to FIG. 7, in transmission gate circuit TG12, data transmitted to local I/O line pair LIO12, /LIO12 are transmitted to global I/O line pair GIO31, /SIO31 when sense amplifier activating signal S0N1 is at the H level and sense amplifier activating signal S0P1 is at the L level, respectively.

Transmission gate circuit TG22 has a similar circuit structure as the above described transmission gate circuit TQ12, and data transmitted to local I/O line pair LIO22, /LIO22 are transmitted to global I/O line pair GIO11, /GIO11 when sense amplifier activating signal S0N2 is at the H level and sense amplifier activating signal S0P2 is at the L level, respectively.

Transmission gate circuits TRG11, TG12, TG21 and TG22 are shown as CMOS type transmission gate circuit receiving sense amplifier activating signal S0N1, S0P1 or sense amplifier activating signal S0N2 and S0P2 at their gate electrodes. However, these gates may be formed by N channel MOS transistors (hereinafter referred to as NMOS transistors) only, or by P channel MOS transistors (hereinafter referred to as PMOS transistors) only. As for the gate input, the input need not be the sense amplifier activating signals S0N1 and S0P1 or S0N2 and S0P2. However, by using these signals running on the sense amplifier block also for controlling the transmission gate circuit, the necessity of providing additional signal line can be eliminated, and therefore it is effective in reducing array area. The same applies to the transmission gate circuits TG31, TG32, TG41 and TG42 included in base block BB, which will be described later.

Figure 8:
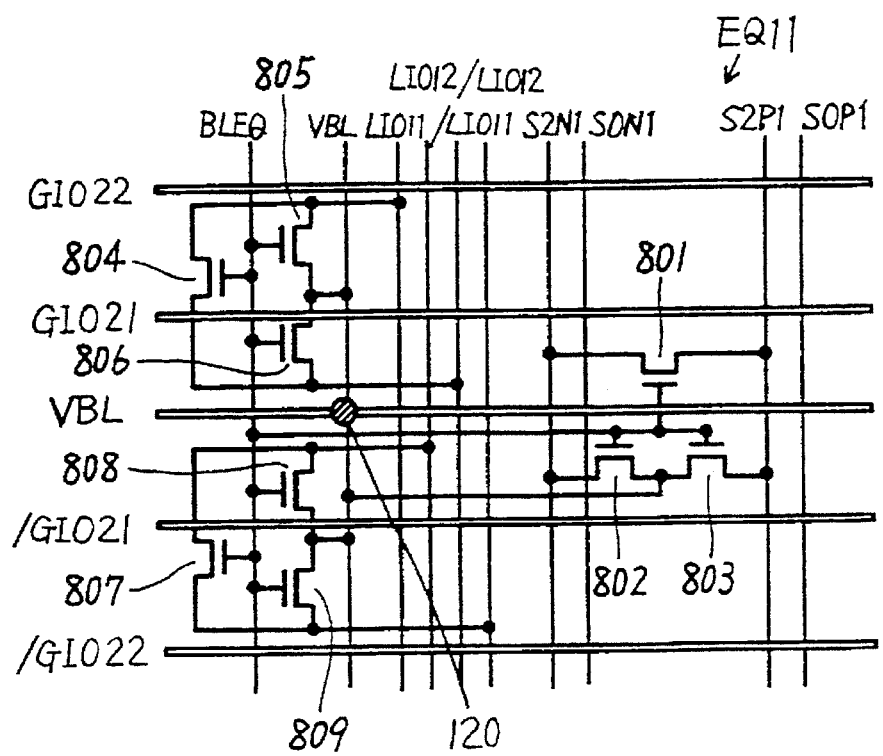
FIG. 8 shows a specific example of precharge/equalizing circuit of FIG. 2.

Referring to FIG. 8, precharge/equalizing circuit EQ11 is controlled by bit line pair equalizing signal BLEQ. When bit line pair equalizing signal BLEQ transmitting signal line BLEQ attains to the H level, an NMOS transistor connected between local I/O line pairs LIO11, /LIO11 and LIO12, /LIO12 turns on, the bit line pair is precharged/equalized to $V_{BL}$. Further, an NMOS transistor connected between sense amplifier driving lines S2N1 and S2P1 also turns on, and lines S2N1 and S2P1 are precharged and equalized at the bit line precharge voltage $V_{BL}$.

Figure 9:
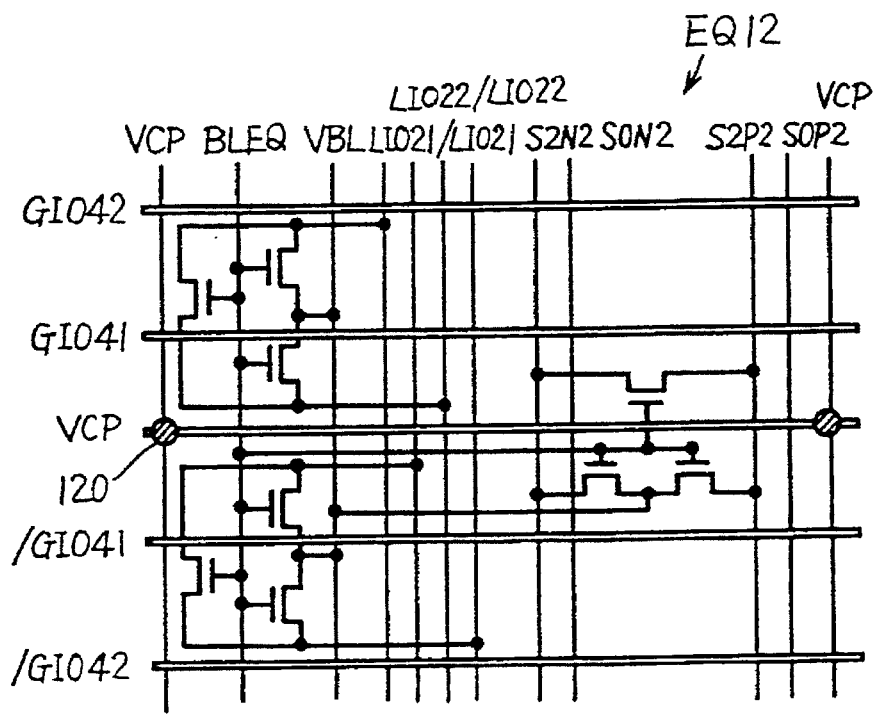
FIG. 9 shows a specific example of the precharge/equalizing circuit.

Referring to FIG. 9, precharge/equalizing circuit EQ12 is controlled by bit line pair equalizing signal BLEQ. When bit line pair equalizing signal BLEQ transmitting over signal line BLEQ attains to the H level, an NMOS transistor connected between local I/O line pairs LIO21, /LIO21 and LIO22, /LIO22 turns on, and local I/O line pairs LIO21, /LIO21 and LIO22, /LIO22 are precharged/equalized. Further, an NMOS transistor connected between sense amplifier driving lines S2N2 and S2P2 also turns on, and sense amplifier driving lines S2N2 and S2P2 are precharged and equalized at the bit line precharge voltage $V_{BL}$.

Figure 10:
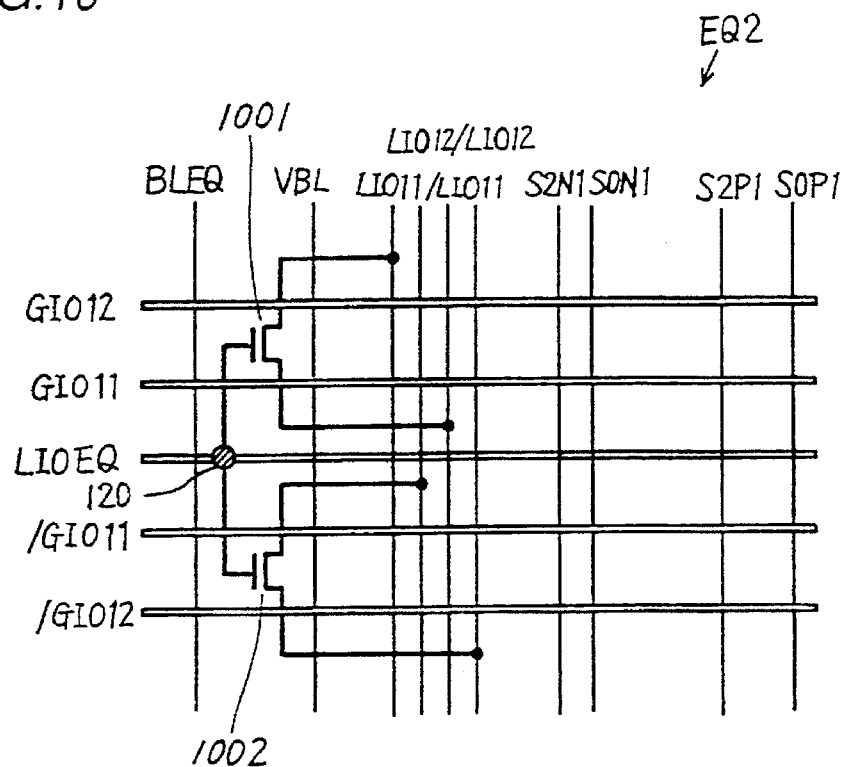
FIG. 10 shows a specific example of the equalizing circuit shown in FIG. 2.

Referring to FIG. 10, equalizing circuit EQ2 is controlled by local IO line pair equalizing signal LIOEQ (LIOEQ1 or LIOEQ2) output at a timing shown in FIG. 11, which will be described later. When the local I/O line pair equalizing signal LIOEQ transmitted over signal line LIOEQ attains to the H level, two NMOS their gate electrode their gate electrodes connected to signal line LIOEQ via through hole 120 turn on, and two pairs of local I/O lines LIO11, /LIO11 and LIO12, /LIO12, or LIO21, /LIO21 and LIO22, /LIO22 are equalized.

The data transmission path in base block AA shown in FIG. 2 will be described in detail.

Assume, for example, that a certain memory block having the structure of base block AA shown in FIG. 2 is selected, word line WL0 is activated, thereafter the sense amplifier is activated and the column selecting line CSL1 is activated. Then, I/O gates I/OG 203#0, 203#1, 203#2 and 203#3 included in sense amplifier bands S/A#0, S/A#1, S/A#2 and S/A#3, respectively, of sense amplifier blocks SABL1 and SABR1 turn on, whereby bit line pairs BL0, BL1, BL2 and BL3 are connected to the corresponding local I/O line pairs LIO11, /LIO11, LIO12, /LIO12, LIO21, /LIO21 and LIO22, /LIO22, respectively. As transmission gates TG11, TG12, TG21 and TG22 arranged in shunt regions shunt 5L, shunt 4L, shunt 3R and shunt 2R have been turned on upon reception of sense amplifier activating signals S0N1, S0P1 and S0N2 and S0P2, data on the local I/O line pairs are immediately transmitted to global I/O line pairs GO, /GO, GIO31, /GIO31, GIO21, /GIO21 and GIO11, /SIO11, through respective transmission gate circuits, and input to preamplifier 107 (FIG. 1).

In such a shared sense amplifier structure as shown in FIG. 2, when four bit line pairs are to be selected by one column selecting line as described above, at least four local I/O line pairs and four global I/O line pairs are necessary for outputting one bit of data from the selected memory block to the I/O lines, and four transmission gate circuits are necessary for connecting the local I/O line pairs to the global I/O line pairs. Therefore, in this example in which the local I/O line pairs are equally divided by one fourth the entire length of the memory block as shown in FIG. 1, the transmission gate circuit such as shown in FIGS. 6 and 7 connect only one pair of local I/O lines and global I/O lines at one shunt region, and remaining another pair of local I/O lines and global I/O lines are passed. Therefore, four sets of transmission gate circuits are necessary. Further, in the present structure, data are output two bits by two bits to the two pairs of local I/O lines extending over the sense amplifier blocks on the left and right sides of the selected memory block, and therefore transmission gate circuits must be arranged at two portions in each of the left and right shunt regions. In FIG. 2, transmission gate circuits are arranged in shunt regions shunt 4L and shunt 5L on the left side and in shunt regions shunt 3R and shunt 2R on the right side, which are connected to the inner global I/O line pair among the five lines arranged in the row direction. The global I/O line pair extending on the outer sides is the global I/O line pair for transmitting the data of the blocks #16 to #31 (base block BB, which will be described later) on the right side of FIG. 1. The lines are not connected but only pass over the blocks #0 to #15 which has the structure of base block AA.

In the present structure in which the local I/O line pair has ¼ times the length, in order to precharge and equalize the local I/O line pairs by precharge/equalizing circuits EQ11, EQ12, and equalizing circuits EQ21 and EQ2 shown in FIGS. 8 and 9, the equalizing circuits have only to be arranged at only two of the four shunt regions shunt 2–5.

Figure 11:
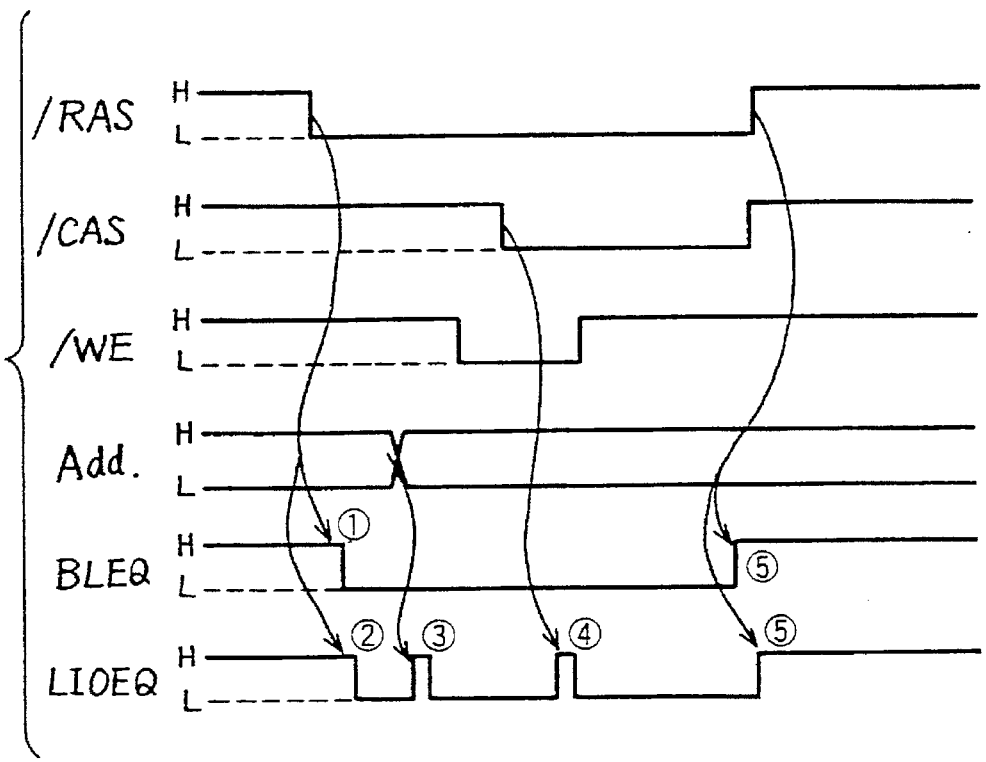
FIG. 11 is a timing chart showing equalizing signals input to the precharge/equalizing circuits of FIGS. 8 and 9 and to the equalizing circuit of FIG. 10.

Referring to FIG. 11, when an external row address strobe signal/RAS falls from the H (logic high) level to the L (logic) level, bit line equalizing signal BLEQ falls from the H level to the L level (①).

Bit line equalizing signal BLEQ attains to the L level and, and after a while column enable signal CE (not shown) is activated. In response to the activation of the signal, local I/O line equalizing signal LIOEQ falls from the H level to the L level, so that local I/O lines are set to the floating state (②).

Thereafter, every time the address Add. changes, the local I/O line equalizing signal LIOEQ is generated as a pulse (③).

In a write cycle, in response to write pulse generating signal (not shown) which is generated at the fall of a column address strobe signal/CAS, local I/O line equalizing signal LIOEQ is generated (④).

When the RAS cycle is completed and the external row address strobe signal/RAS rises from the L level to the H level, bit line equalizing signal BLEQ and local I/O line equalizing signal LIOEQ are both activated (⑤).

That the sense amplifier driving lines S2N1, S2P1, S2N2 and S2P2 are divided at one fourth the length, as is the local I/O line pair, does not cause any problem in circuit operation. However, different from the divided local I/O line pairs, if the sense nodes are connected and not divided, stable operation is ensured. Therefore, in a block of 512K, a sense node is precharged and equalized by two precharge/equalizing circuits EQ11 and EQ12.

Equalizing circuit EQ2 has only to be arranged at two of the four shunt regions, similar to precharge/equalizing circuits EQ11, ED, E and E.

As for the arrangement of five lines over the shunt region, $V_{BL}$ line, $V_{CP}$ line or the signal line LIOEQ is arranged at the center in every shunt region, and on both sides of the central line, global I/O line pair GIO1, /GIO1 is arranged, and further outside, global I/O line pair GIO2, /GIO2 is arranged.

Because of this arrangement, global I/O line pairs are commonly influenced by the coupling noise caused by the signal line LIOEQ, which means that noise resistance is improved and array operation margin is improved.

As for the central line, in shunt region shunt 2 and shunt 4 where equalizing circuits EQ2 are arranged, the central line is limited to the signal line LIOEQ. However, in shunt regions shunt 3 and shunt 5, either $V_{BL}$ line or $V_{CP}$ may be provided. The $V_{BL}$ line and $V_{CP}$ line are connected to the $V_{BL}$ line and $V_{CP}$ line extending parallel to the local I/O line pairs in shunt regions shunt 3 and shunt 5 via through holes, whereby the power supply is reinforced.

Figure 12:
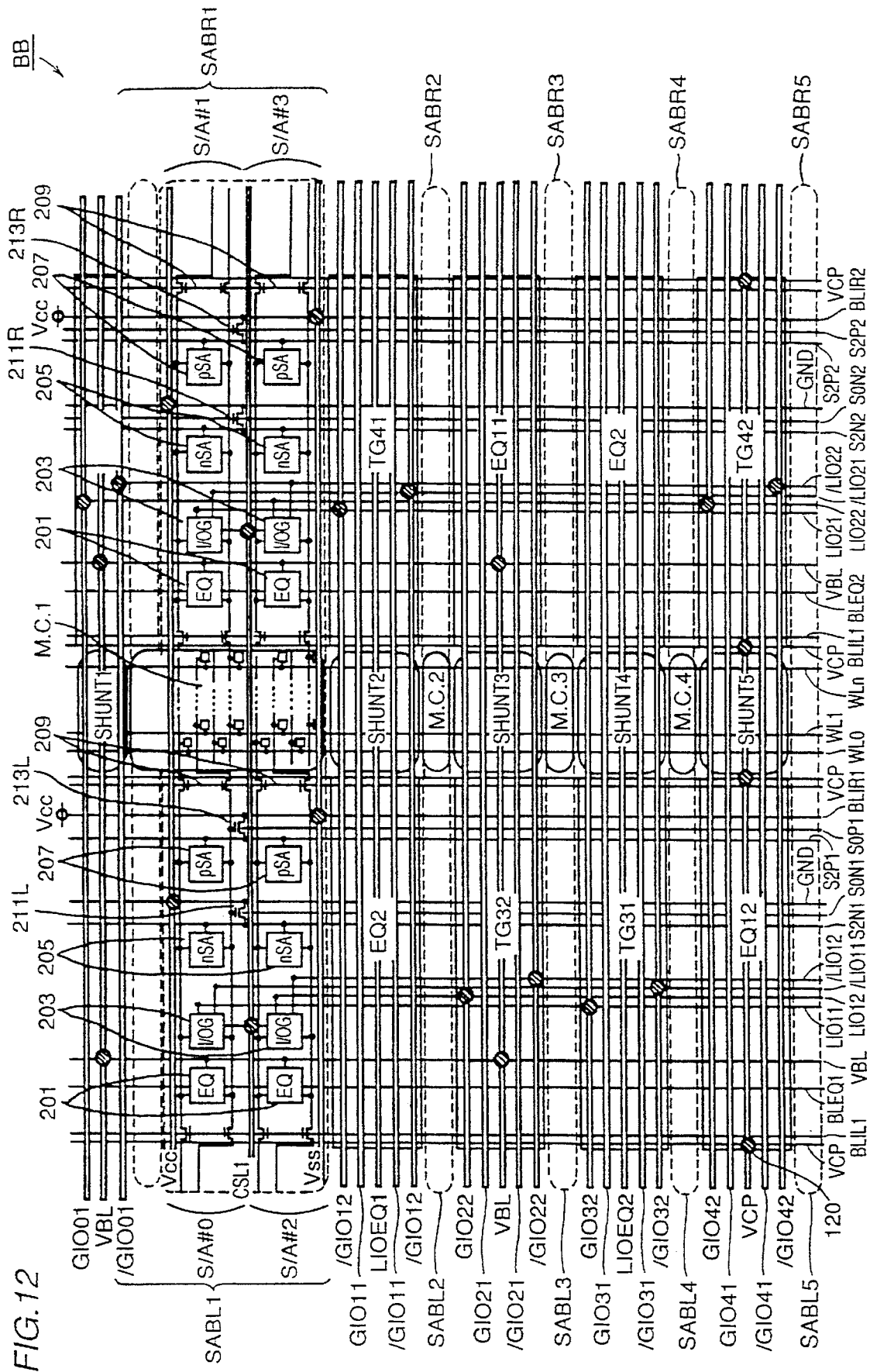
FIG. 12 shows, in detail, a structure of the base block BB shown in FIG. 1.

Referring to FIGS. 12, basic structure of base block BB is similar to that of base block AA shown in FIG. 2.

Local I/O line pairs LIO11, /LIO11, LIO12, /LIO12, LIO21, /LIO21 and LIO22, /LIO22 are connected to global I/O line pairs GIO32, /GIO32, GIO22, /GIO22, GIO12, /GIO12 and GIO01, /GIO01, respectively.

Figure 13:
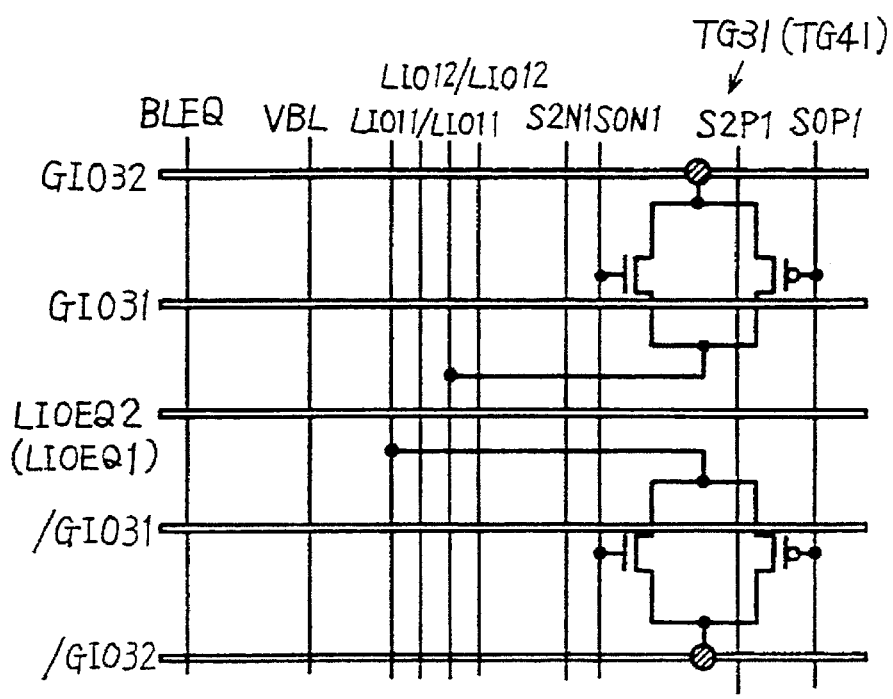
FIG. 13 shows a structure of a transmission gate circuit in the gate block BB of FIG. 12.

Referring to FIG. 13, in a transmission gate circuit TG31 (TG41), the data transmitted to local I/O line pair LIO11, /LIO11 (LIO21, /LIO21) are transmitted to global I/O line pair GIO32, /GIO32 (GIO12, /GIO12) when sense amplifier activating signal S0N1 (S0N2) is at the H level and the sense amplifier activating signal S0P1 (S0P2) is at the L level, respectively.

Figure 14:
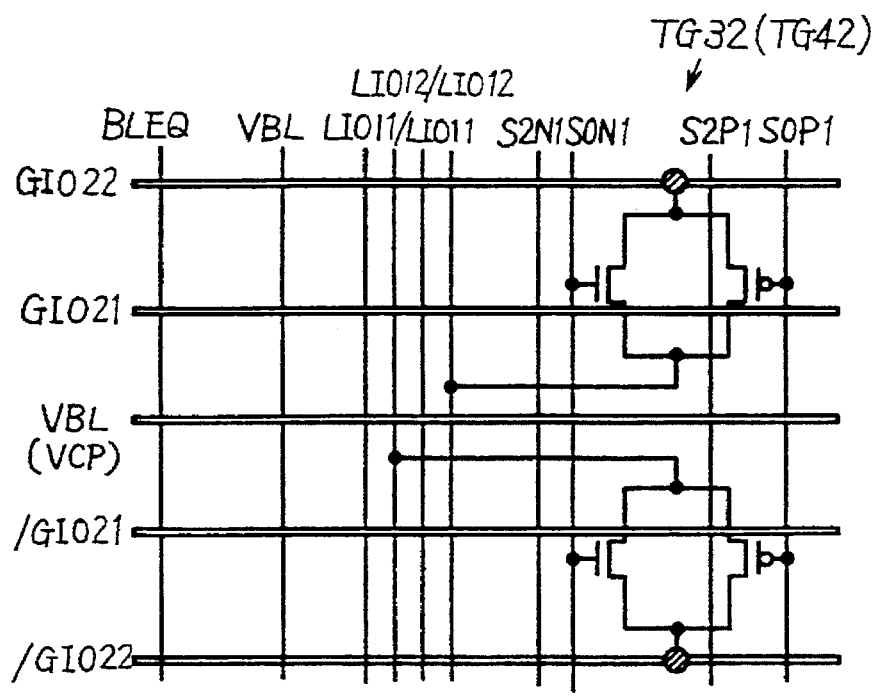
FIG. 14 shows a structure of a transmission gate circuit in the base block BB of FIG. 12.

Referring to FIG. 14, in transmission gate circuit TG32 (TG42), the data transmitted to local I/O line pair LIO12, /LIO12 (LIO22, /LIO22) are transmitted to global I/O line pair (GIO22, /GIO22 (GIO01, /GIO01) when sense amplifier activating signal S0N1 (/S0N2) is at the H level and sense amplifier activating signal S0P1 (S0P2) is at the L level, respectively.

Now, sense amplifier activating signals S0N1 and S0N2 are transmitted through signal line S0N, and sense amplifier activating signals S0P1 and S0P2 are transmitted to signal line S0P.

In shunt regions shunt 2R, shunt 3L, shunt 4L and shunt 5R, transmission gate circuits TG41, TG32, TG31 and TG42 are arranged, respectively, and in shunt region shunt 3R, precharge/equalizing circuit EQ11 is arranged. In shunt region shunt 5L, precharge/equalizing circuits EQ12 is arranged. In shunt region shunt 2L and shunt 4R, equalizing circuits EQ2 are arranged.

In shunt region shunt 1R, transmission gate TG41 is arranged. By transmission gate circuit TG49, the data in sense amplifier band S/A#1 is transmitted to global I/O line pair GIO01, /GIO01. Transmission gate TG42' arranged in shunt region shunt 5R is for transmitting data of the memory block therebelow.

Global I/O line pair GIO11, /GIO11, GIO21, /GIO21, GIO31, /GIO31 and GIO41, /GIO41 are for transmitting data of the blocks #0 to #15 having the structure of base block AA shown in FIG. 2. Therefore, these are not necessary in the shunt regions of the blocks #16 to #31 having the structure of the base block BB. However, in order to ensure the same line capacitances as global I/O line pairs GIO12, /GIO12, GIO22, /GIO22, GIO32 and GIO42, /GIO42, and to facilitate uniform processing, the global I/O line pairs are adapted to have the same length, extending from one to the other end of the entire memory block.

In FIG. 1, transmission gates in blocks #0 to #16 are arranged irregularly, in order to avoid data conflict when two blocks are operated in the 4K refreshing operation.

Further, arrangement of transmission gate circuits, precharge/equalizing circuits and equalizing circuits as well as line arrangement in the horizontal direction are repeated by the unit of 4M block at which the local I/O line pairs are divided.

Figure 15:
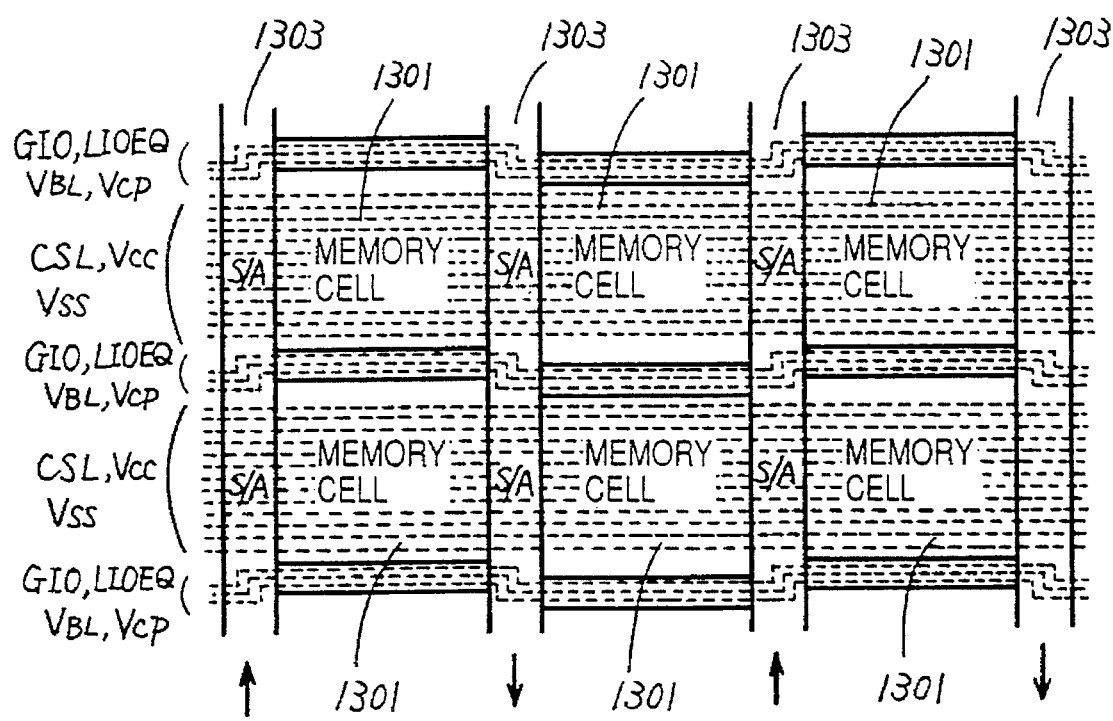
FIG. 15 shows a manner of connection between lines across the memory cell blocks and sense amplifier bands in the semiconductor memory device in accordance with the first embodiment of the present invention.

In order to connect bit lines and sense amplifier band S/A straight, the sense amplifier band (S/A) 1303 must be shifted alternately from the direction of the arrow in FIG. 15. Accordingly, lines (GIO, $V_{CP}$, $V_{BL}$, LIOET for which through holes must be provided in shunt regions shunt 1–5R and shunt 1–5L are bent alternately in the shunt region. Meanwhile, lines (CSL, Vcc, Vss) for which through holes should be provided in the sense amplifier bands (S/A) 1303 are arranged straight to blocks #0–#31. By this modification of the layout, bit line holding region which has been conventionally required in the alternately arranged sense amplifier band is eliminated, and connection from the aluminum interconnection layer to the lower interconnection layers becomes possible. This allows reduction in array area.

Figure 16:
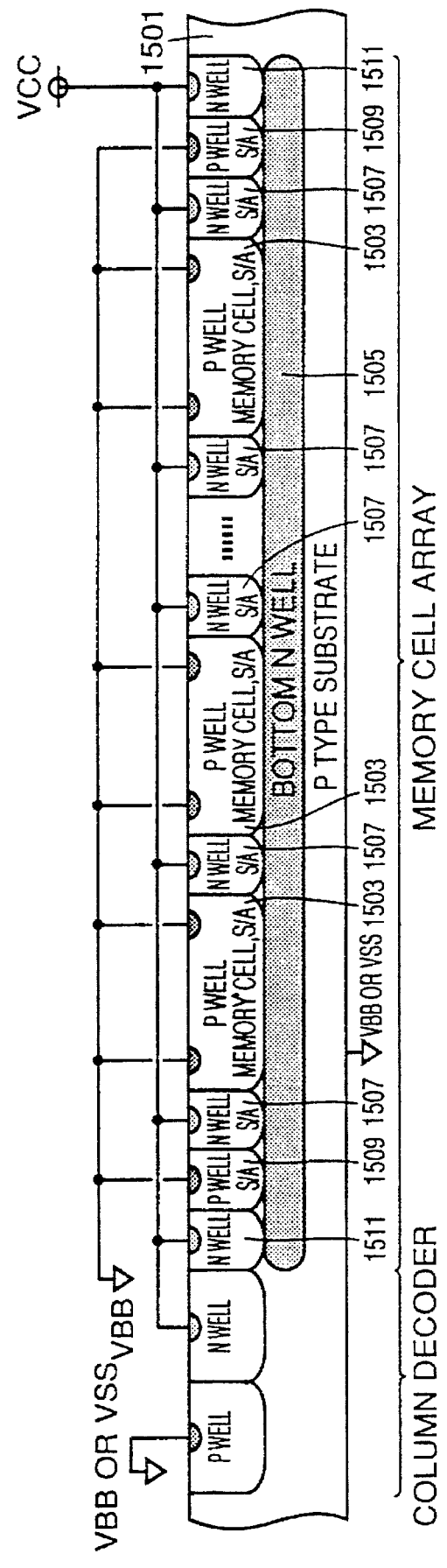
FIG. 16 is a cross section taken along the column selecting line, showing the triple well structure of the memory cell array and the column decoder in a conventional semiconductor memory device.
Figure 17:
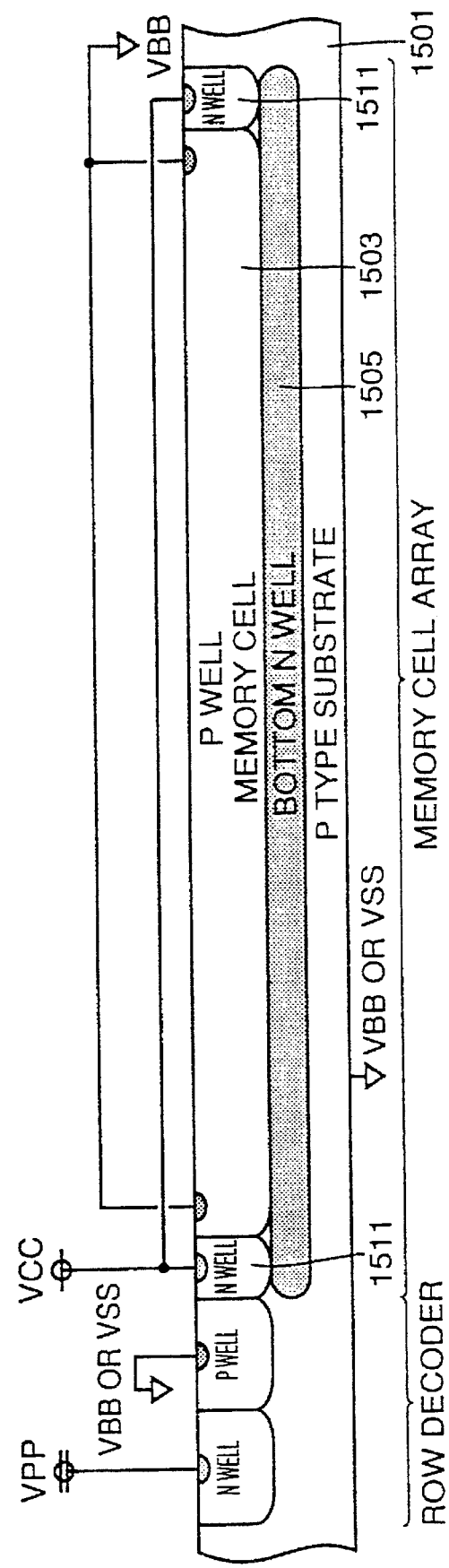
FIG. 17 is a cross section of the triple well structure shown in FIG. 16 taken along the word lines.

Referring to FIGS. 16 and 17, a bottom N well 1505 is formed in a P type substrate 1501, and on bottom N well 1505, P type wells 1503 for memory cells an N channel sense amplifiers, N type wells 1507 for P channel sense amplifiers, and P type wells 1509 for N channel sense amplifiers are formed. On bottom N well 1505, an N well 1511 is further formed to surround P type wells 1509 and 1503. To P type substrate 1501, the ground voltage $V_{ss}$ or a substrate voltage Vbb lower than the ground voltage is applied. Substrate voltage Vbb is applied to P type wells 1503 and 1509. Power supply voltage Vcc is applied to N type wells 1507 and 1511. Therefore, power supply voltage Vcc is applied to bottom N well 1505 not only through the N type well 1507 for the sense amplifiers but also through the N type well 1511. In this manner, in the conventional semiconductor memory device, power supply voltage Vcc is applied to the bottom N well 1505 through N type well 1511 formed in the periphery of the memory cell array region.

Figure 18:
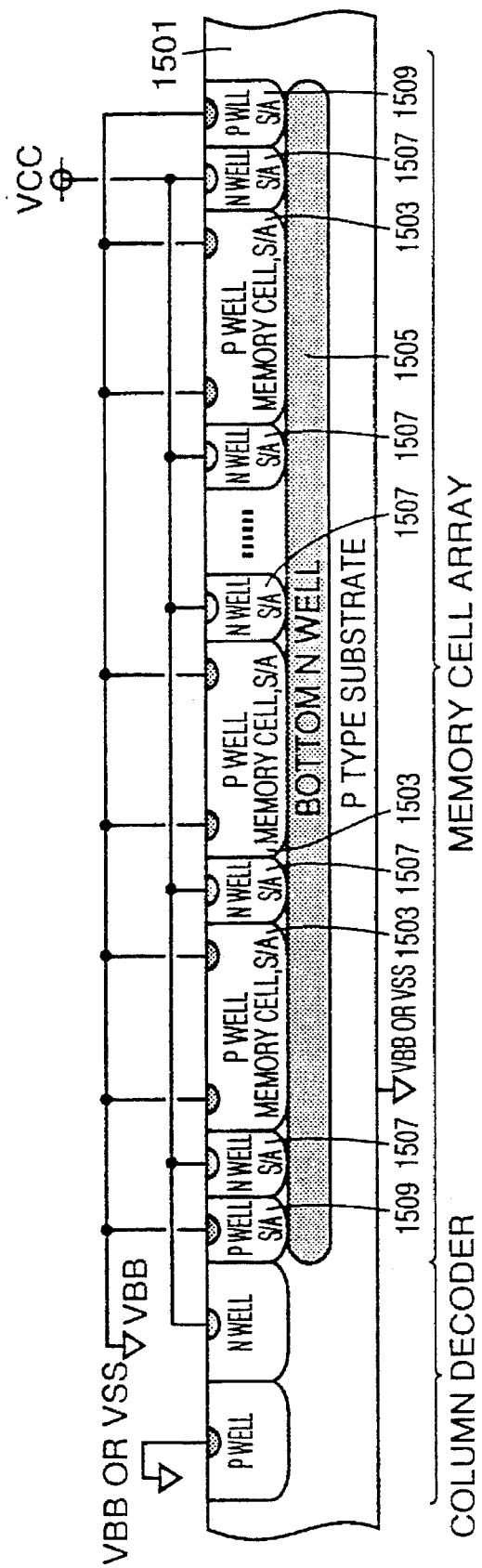
FIG. 18 is a cross section taken along the column selecting line showing the triple well structure of the memory cell array and a column decoder in the semiconductor memory device in accordance with the first embodiment of the present invention.
Figure 19:
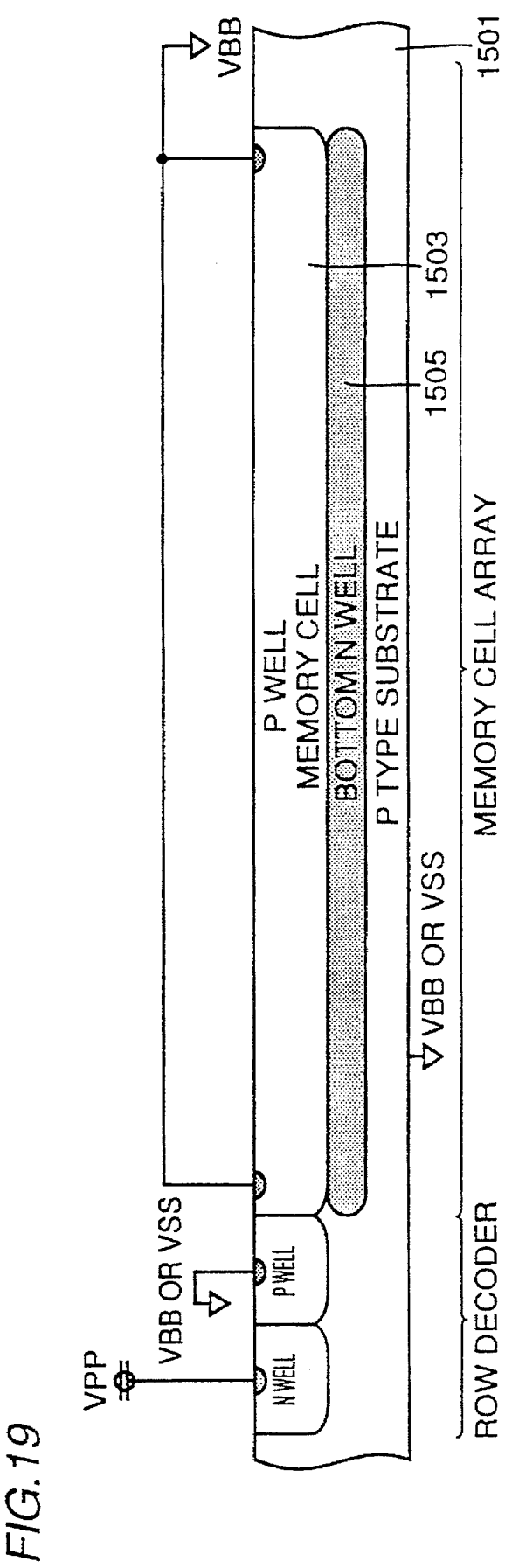
FIG. 19 is a cross section of the triple well structure shown in FIG. 18 taken along the word lines.

Referring to FIGS. 18 and 19, in the first embodiment of the present invention, the N type well 1511 shown in FIGS. 16 and 17 is not provided. However, power supply voltage Vcc is applied to bottom N well 1505 through N type well 1507 for the sense amplifiers. Therefore, layout area of the memory cell array region can be reduced by the amount corresponding to N type well 1511, without degrading voltage stability of bottom N well 1505.

Figure 20A:
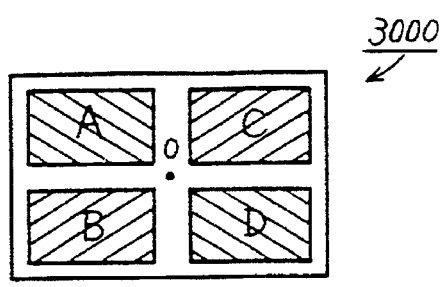
FIGS. 20A to 20C are plan views showing memory cell array arranged in the semiconductor memory device in accordance with the first embodiment of the present invention.
Figure 20B:
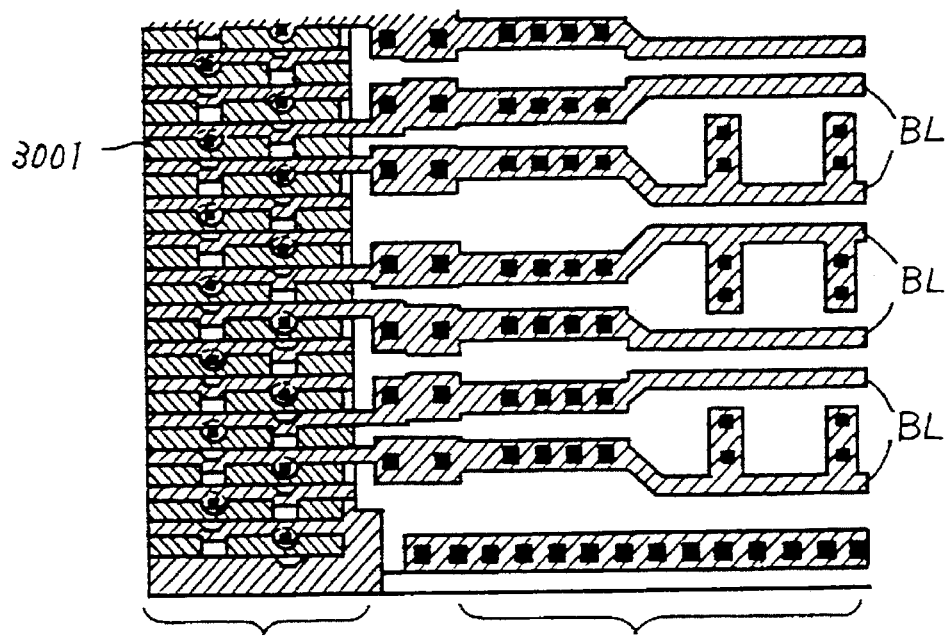
Figure 20C:
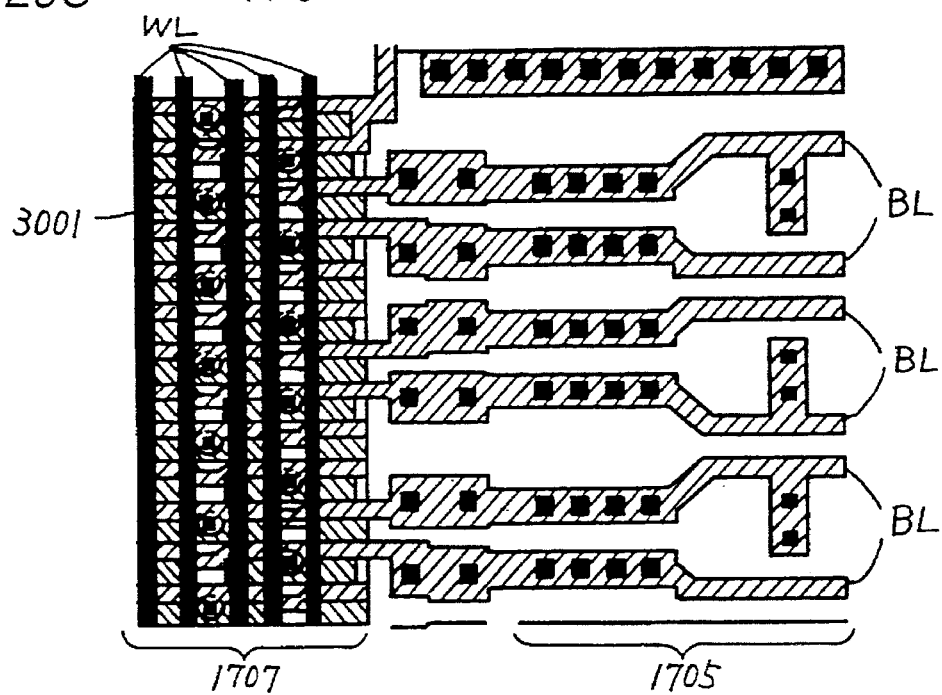

Referring to FIG. 20A, circuits included in planes A, B, C and D have mirror-symmetrical layout with respect to the origin O. FIG. 20B is an enlarged view of the layout of a portion of the circuitry in plane A, including a sense amplifier block 1701 and a memory cell block 1703. FIG. 20C is an enlarged view of a portion of a circuitry in plane B, including a sense amplifier block 1705 and a memory cell block 1707. Memory cell blocks 1703 and 1705 include a plurality of memory cells 3001. The reference character WL denotes a word line, which is also arranged in planes A, C and D, though not shown.

Sense amplifier block 1701 of FIG. 20B and sense amplifier block 1705 of FIG. 20C are in mirror-symmetry with respect to the origin 0. Meanwhile, memory cell block 1703 of FIG. 20B and memory cell block 1707 of FIG. 20C have parallel positional relation. More specifically, row decoders, column decoders and sense amplifiers are in mirror-symmetrical positional relation with respect to origin O in four planes A, B, C and D, while memory cells 3001 are in parallel positional relation.

In this manner, since orientation of the memory cell shapes, which are most difficult to process, are all aligned in the planes, process efficiency can be improved.

Figure 21:
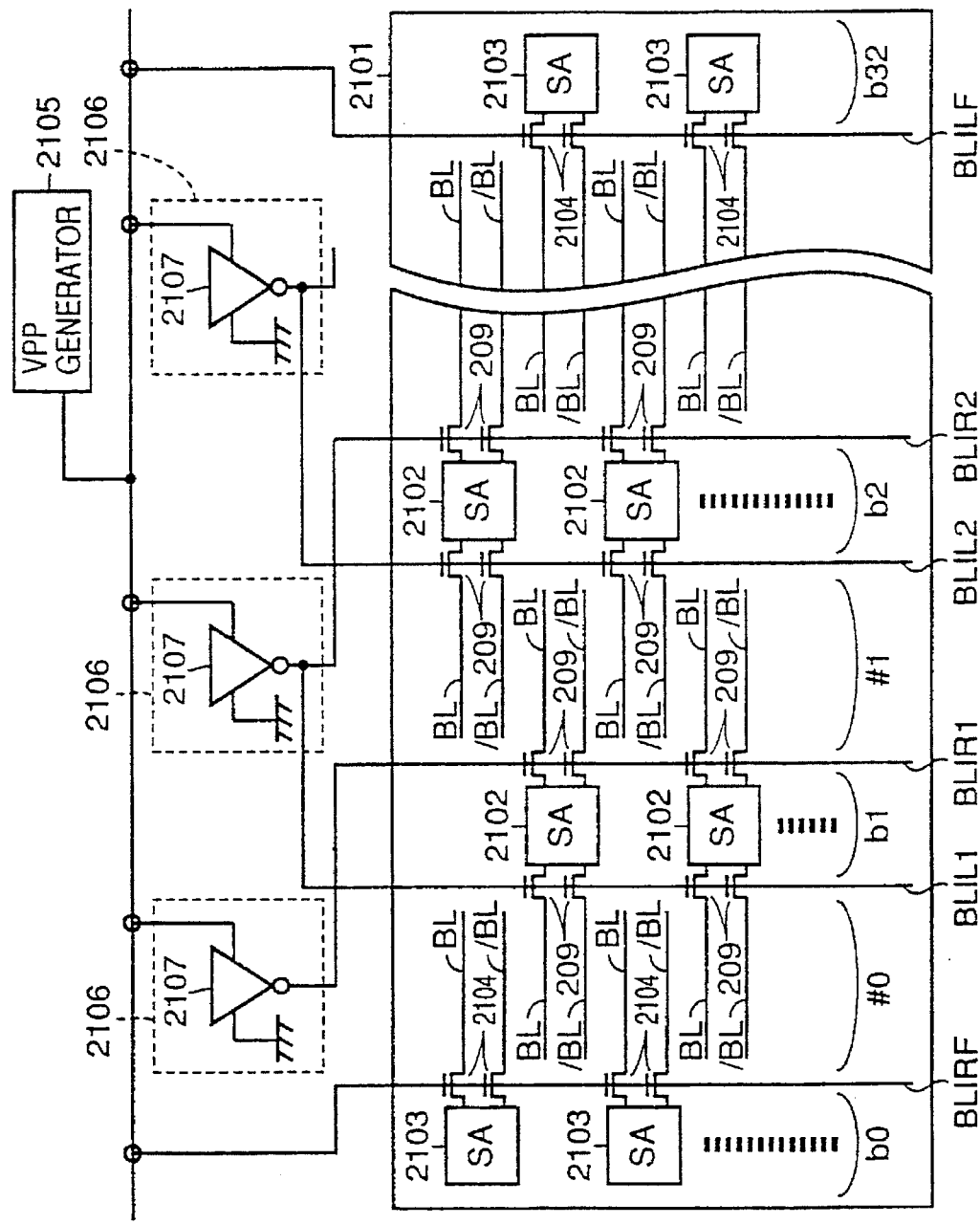
FIG. 21 is a block diagram showing a shared sense amplifier structure in the semiconductor memory device in accordance with the first embodiment of the present invention.

FIG. 21 is a block diagram showing a shared sense amplifier structure in the semiconductor memory device in accordance with the first embodiment of the present invention. Referring to FIG. 21, a memory array block 2101 includes a plurality of blocks #0, #1, . . . including bit line pairs BL, /BL, word lines (not shown) and memory cells, and a plurality of sense amplifier block portions b0–b32. Sense amplifier block portions b0 and b32 at both ends of memory array block 2101 have, similar to sense amplifier block portions bb1, bb2, . . . of the inner side, a plurality of sense amplifiers (SA) 2103. Each sense amplifier 2102 on the inner side is connected to two bit line pairs BL, /BL on both sides thereof through shared gates 209, while each sense amplifier 2103 at the end portion is connected to only one bit line pair BL, /BL on either side through shared gate 2104.

A plurality of shared gate driving circuits 2106 are provided corresponding to the plurality of blocks. Each shared gate driving circuit 2106 includes an inverter 2107, and output nodes of inverters 2107 are commonly connected to the gate electrode of shared gate 209 for disconnecting two blocks adjacent to the corresponding block. To the inverters 2107, a boosted power supply voltage VPP which is higher than the power supply voltage Vcc, is applied from a boosted power supply voltage (VPP) generator 2105. Shared gates 2104 are commonly connected by selecting lines BLIRF and BLILF, so that the boosted power supply voltage VPP is constantly applied to the shared gates 2104. Therefore, the shared gates 2104 are normally on.

The shared gates 2104 need not be connected to the sense amplifiers 2103 on both ends of memory array block 2101. However, provision of such normally on shared gates 2104 allows regular overall configuration of memory array block 2101.

Figure 22:
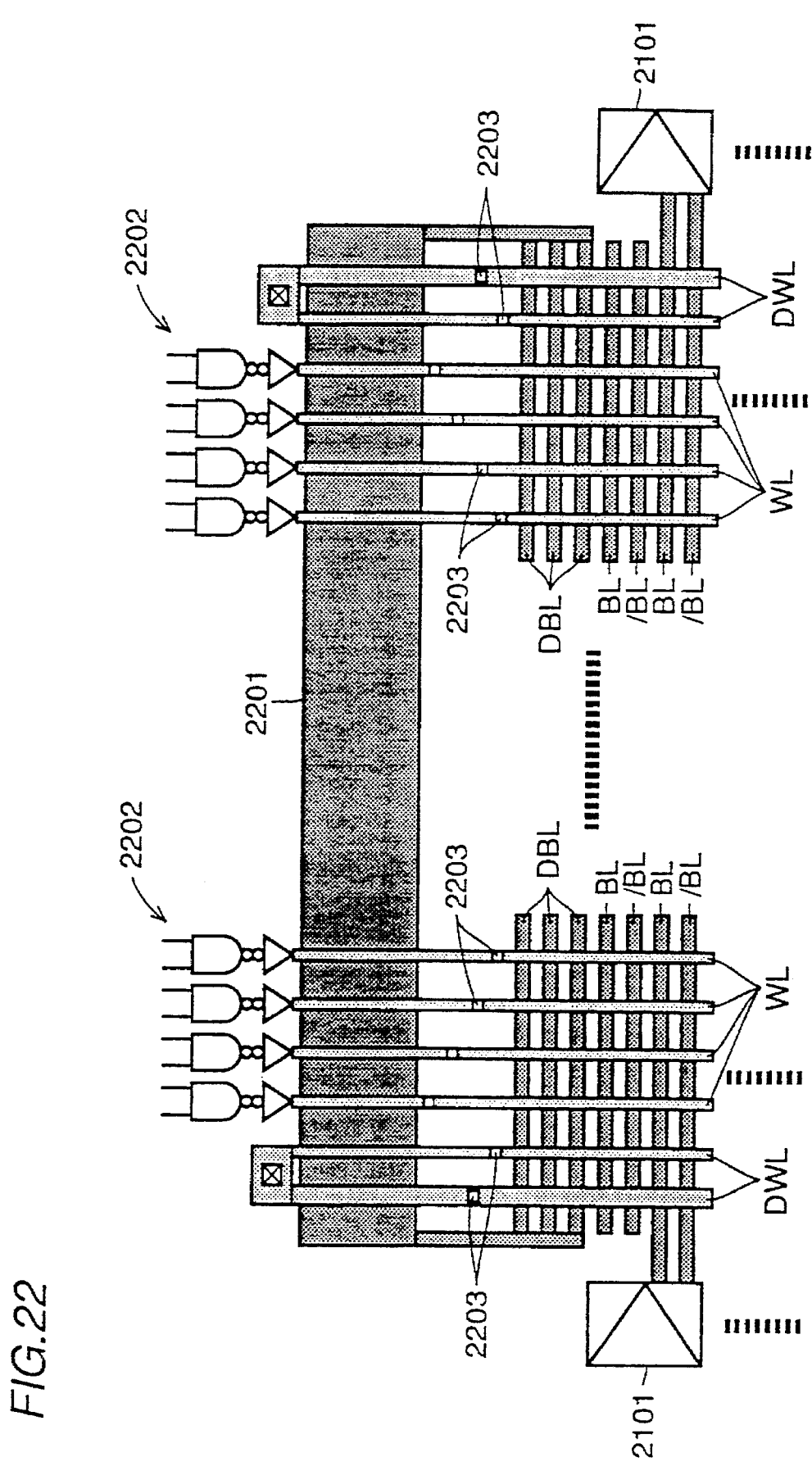
FIG. 22 is a plan view showing structures in the vicinity of a border between a row decoder and a memory cell array, in the semiconductor memory device in accordance with the first embodiment of the present invention.

As shown in FIG. 22, between memory cell array and row decoder/word driver 2202, there is formed an underlying layer 2201. The underlying layer 2201 is the same layer as bit lines BL and /BL. Further, the underlying layer 2201 is connected to a dummy bit line DBL. Since a voltage at the level of Vcc/2 is applied to the dummy bit line DBL, underlying layer 2201 is fixed by the voltage at the level of Vcc/2.

Further, dummy word lines DWL are formed along the outermost word line WL. Of the dummy word lines DWL, the outermost one is made thicker than others. The ground voltage $V_{ss}$ is applied to the dummy word lines DWL. Not only the word lines WL but also the dummy word lines DWL are connected to the first layer of aluminum interconnection (not shown) via through holes 2203 in shunt region shunt 1.

Since the number of layers in the memory cell array region is larger than that in the row decoder/word driver regions, the height of the memory cell array region is higher than that of the row decoder/word driver region. However, since underlying layer 2201 is formed near the boundary between the memory cell array region and the row decoder/word driver, the level difference between the memory cell array region and the row decoder/word driver is relaxed. Though aluminum lines for word line shunting are formed with the same pitch as word lines L, aluminum lines for word shunting can be readily ensured as the level difference is relaxed in this manner.

Figure 23:
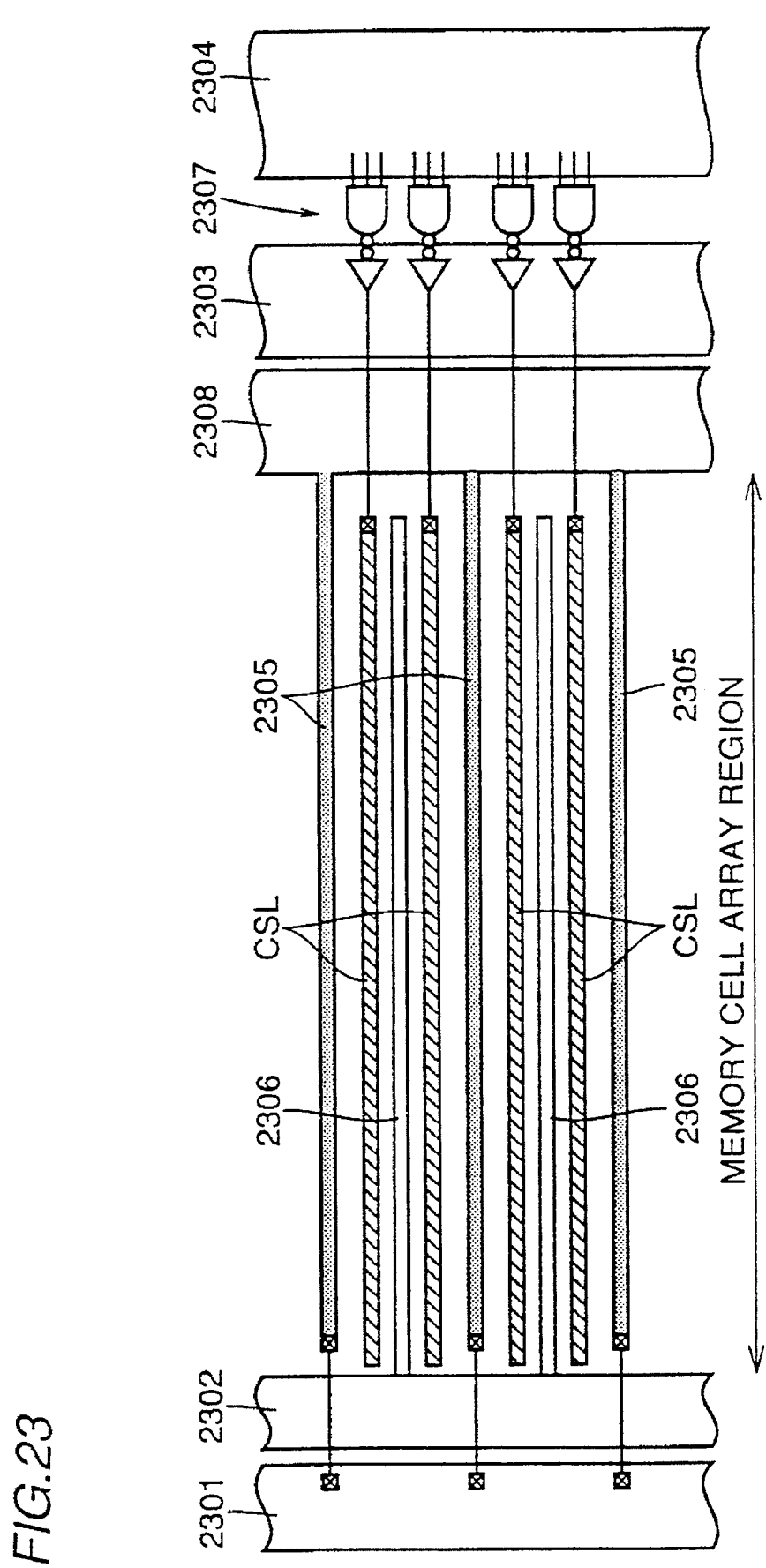
FIG. 23 is a plan view showing an arrangement of the memory cell array and power supply and ground lines in the periphery, in the semiconductor memory device in accordance with the first embodiment of the present invention.

Referring to FIG. 23, a mesh power supply line 2308 for supplying the power supply voltage Vcc to the memory cell array region is formed separate from the power supply line 2303 for supplying the power supply voltage Vcc to the column decoder and the column selecting line drivers. A column decoder/column selecting line driver 2307 for driving the column selecting lines CSL in the memory cell array region is connected to power supply line 2303 for the column decoder and the column selecting line driver and to a ground line 2304. A mesh power supply line 2305 which extends along the column selecting line CSL in the memory cell array region is connected to mesh power supply line 2308 at the center of the chip, as well as to a mesh power supply line 2301 at the outer periphery of the chip. A mesh ground line 2306 extending along the column selecting line CSL in the memory cell array region is connected only to the mesh ground line 2302 at the outer periphery of the chip.

Since mesh power supply line 2308 is formed separate from power supply line 2303 for the column decoder and the column selecting line driver, column selecting line CSL rises and falls quickly, and sense amplifier operation is stabilized.

Figure 24:
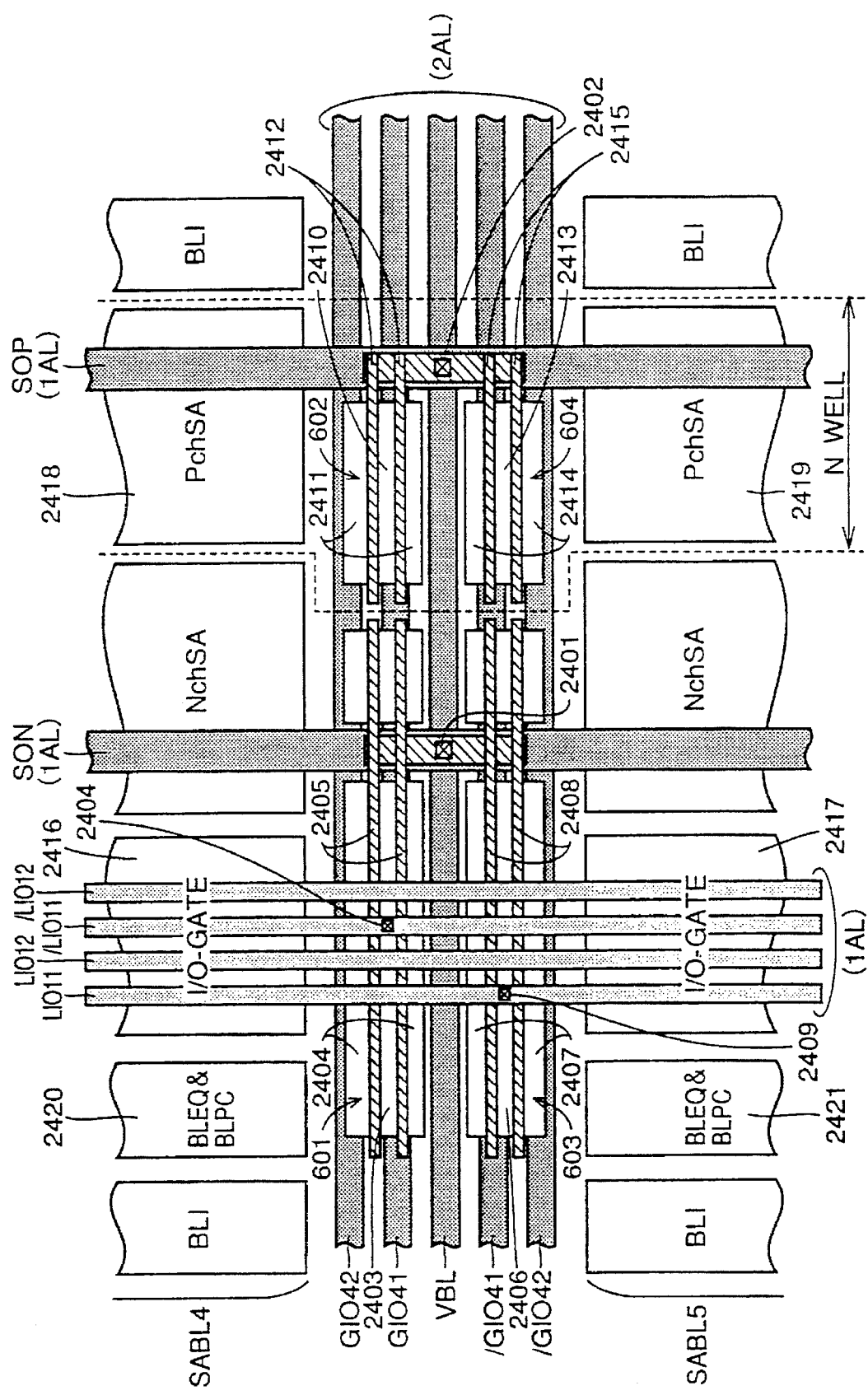
FIG. 24 is a plan view showing specific structure of the transmission gate circuit shown in FIG. 6.

Referring to FIG. 24, transmission gate circuit TGll for transferring data between local I/O line pair LIO11, /LIO11 and global I/O line pair GIO41, /GIO41 is arranged adjacent to a shunt region (shunt 5 of FIG. 20). The transmission gate for transferring data between local I/O line /LIO11 and global I/O line GIO41 includes an N channel MOS transistor 601 and a P channel MOS transistor 602. A transmission gate for transferring data between local I/O line LIO11 and global I/O line /GIO41 includes an N channel MOS transistor 603 and a P channel MOS transistor 604. N channel MOS transistors 601 and 603 are arranged between an I/O gate region 2416 in sense amplifier block SABL4 and an I/O gate region 2417 in sense amplifier block SABL5 which is adjacent to sense amplifier block SABL4. P channel MOS transistors 602 and 604 are arranged between P channel sense amplifier region 2418 in sense amplifier block SABL4 and a P channel sense amplifier region 2419 in sense amplifier block SABL5 which is adjacent to sense amplifier block SABL4.

One of the source/drain regions 2403 of N channel MOS transistor 601 is connected to one of the source/drain regions 2410 of P channel MOS transistor 602 through an intermediate layer (not shown) which is formed in the same layer as the bit lines. The other one of the source/drain regions 2404 of N channel MOS transistor 601 is connected to the other one of the source/drain regions 2411 of P channel MOS transistor 602 through another intermediate layer (not shown) formed in the same layer as the bit lines. Similarly, source/drain regions 2406 and 2407 of N channel MOS transistor 603 are connected to source/drain regions 2413 and 2414 of P channel MOS transistor 604 through intermediate layers (not shown) formed in the same layer as the bit lines, respectively.

One of the source/drain regions 2403 of N channel MOS transistor 601 is connected to local I/O line /LIO11 through a contact hole 2408. The other one of the source/drain regions 2404 of N channel MOS transistor 601 is connected to global I/O line GIO41 through an intermediate layer (not shown) formed in the same layer as the bit lines. One of the source/drain regions 2406 of N channel MOS transistor 603 is connected to local I/O line /LIO11 through a contact hole 2409. The other one of the source/drain regions 2407 of N channel MOS transistor 603 is connected to global I/O lines /GIO41 through an intermediate layer (not shown) formed in the same layer as the bit lines.

P channel MOS transistors 602 and 604 are formed in the same N well as P channel sense amplifiers. However, that portion of the N well in which P channel MOS transistors 602 and 604 are formed is made wider than other portions.

Gate electrode 205 of N channel MOS transistor 601 and gate electrode 2408 of N channel MOS transistor 603 are connected to the S0N line of the first aluminum layer, through contact hole 2401. Gate electrode 2412 of P channel MOS transistor 602 and gate electrode 2415 of P channel MOS transistor 604 are connected to the S0P line of the first aluminum layer through a contact hole 2402. N channel MOS transistors 601 and 603 are divided to be on both sides of the line S0N, so that S0N line need not be bent or disconnected.

The $V_{BL}$ line of the second aluminum layer is connected to the $V_{BL}$ line of the first aluminum layer passing through bit line equalize/precharge regions 2420 and 2421 via through holes. Therefore, bit line precharge voltage $V_{BL}$ is reinforced.

Since the transmission gate TG11 of the CMOS structure is controlled by sense amplifier activating signals S0N and S0P, it is not necessary to arrange a signal line for supplying a block selecting signal, for example, in the sense amplifier, whereby the width of the sense amplifier band can be reduced. Further, an intermediate layer formed in the same layer as the bit lines is used for interconnection of N channel MOS transistors 601 and 603, so that local I/O line pair LIO11, /LIO11, LIO12, /LIO12, S0N line, S2N line, BLEQ line, $V_{BL}$ line, ground line and so on of the first aluminum layer can be arranged continuously, without disconnected by the regions for the N channel MOS transistors 601 and 603. Further, since an intermediate layer formed in the same layer as the bit lines is used for the interconnection of P channel MOS transistors 602 and 604, S0P line, S2P line, power supply line and so on of the first aluminum layer can be arranged continuously, without disconnected by the regions for the P channel MOS transistors 602 and 604.

Figure 25:
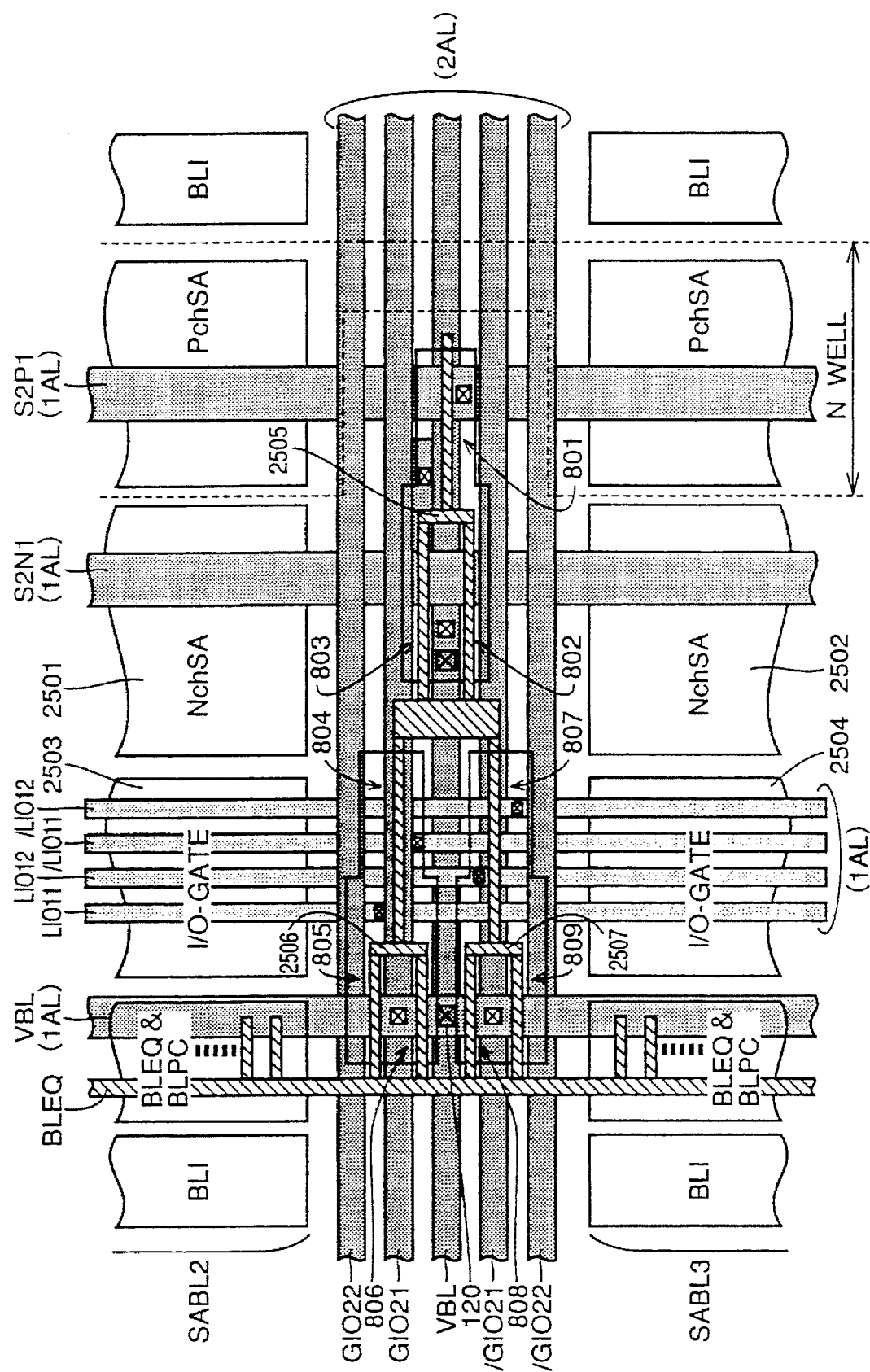
FIG. 25 is a plan view showing a specific structure of the precharge/equalizing circuit shown in FIG. 8.

Referring to FIG. 25, adjacent to one shunt region (shunt 3 of FIG. 2), a precharge equalizing circuit for two local I/O line pairs LIO11, /LIO11 and LIO12, /LIO12, and a precharge equalizing circuit for S2N1 line and S2P1 line are arranged. The precharge/equalizing circuit for the lines S2N1 and S2P1 includes N channel MOS transistors 801 to 803, which are arranged between an N channel sense amplifier region 2501 in sense amplifier block SABL2 and an N channel sense amplifier region 2502 in a sense amplifier block SABL3 which is adjacent to sense amplifier block SABL2. The precharge/equalizing circuit for local I/O line pair LIO11, /LIO11 includes N channel MOS transistors 804–806, which are arranged between an I/O gate region 2503 in sense amplifier block SABL2 and an I/O gate region 2504 in sense amplifier block SABL3 which is adjacent to sense amplifier block SABL2. The precharge/equalizing circuit for local I/O line pair LIO12, /LIO12 includes N channel MOS transistors 807–809, which are arranged between an I/O gate region 2503 in sense amplifier block SABL2 and an I/O gate region 2504 in sense amplifier block SABL3 which is adjacent to sense amplifier block SABL2.

Gate electrodes 2505 of N channel MOS transistors 801–803, gate electrodes 2506 of N channel MOS transistors 804–806 and gate electrodes 2507 of N channel MOS transistors 807–809 each have a Y shape and connected to each other. The gate electrodes 2505–2507 are formed in the same layer as BLEQ line, and gate electrodes 2506 and 2507 are directly connected to BLEQ line. The $V_{BL}$ line of the first aluminum layer is connected to the $V_{BL}$ line of the second aluminum layer via a through hole 120. Thus, the bit line precharge voltage $V_{BL}$ is reinforced.

The N well for the P channel sense amplifiers is formed continuously, not disconnected in the regions below global I/O line pairs GIO21, /GIO21 and GIO22, /GIO22. However, in order to ensure sufficiently large N channel MOS transistors 801–803, the portion of the N well in this region is made narrower than other portions.

The source/drain regions of N channel MOS transistors 801–803 are connected to S2N1 and S2P1 lines through an intermediate layer (not shown) formed in the same layer as the bit lines. Therefore, S2N1 and S2P1 lines of the first aluminum layer can be formed straight, without the necessity of disconnection or bending.

The source/drain regions of N channel MOS transistors 804–809 are also connected to local I/O line pairs LI011, LIO11 and LIO12, /LIO12 through an intermediate layer (not shown) formed in the same layer as the bit lines. Therefore, the $V_{BL}$ line and the local I/O line pairs LIO11, /LIO11 and LIO12, /LIO12 of the first aluminum layer can be formed straight, without the necessity of bending or disconnection.

Figure 26:
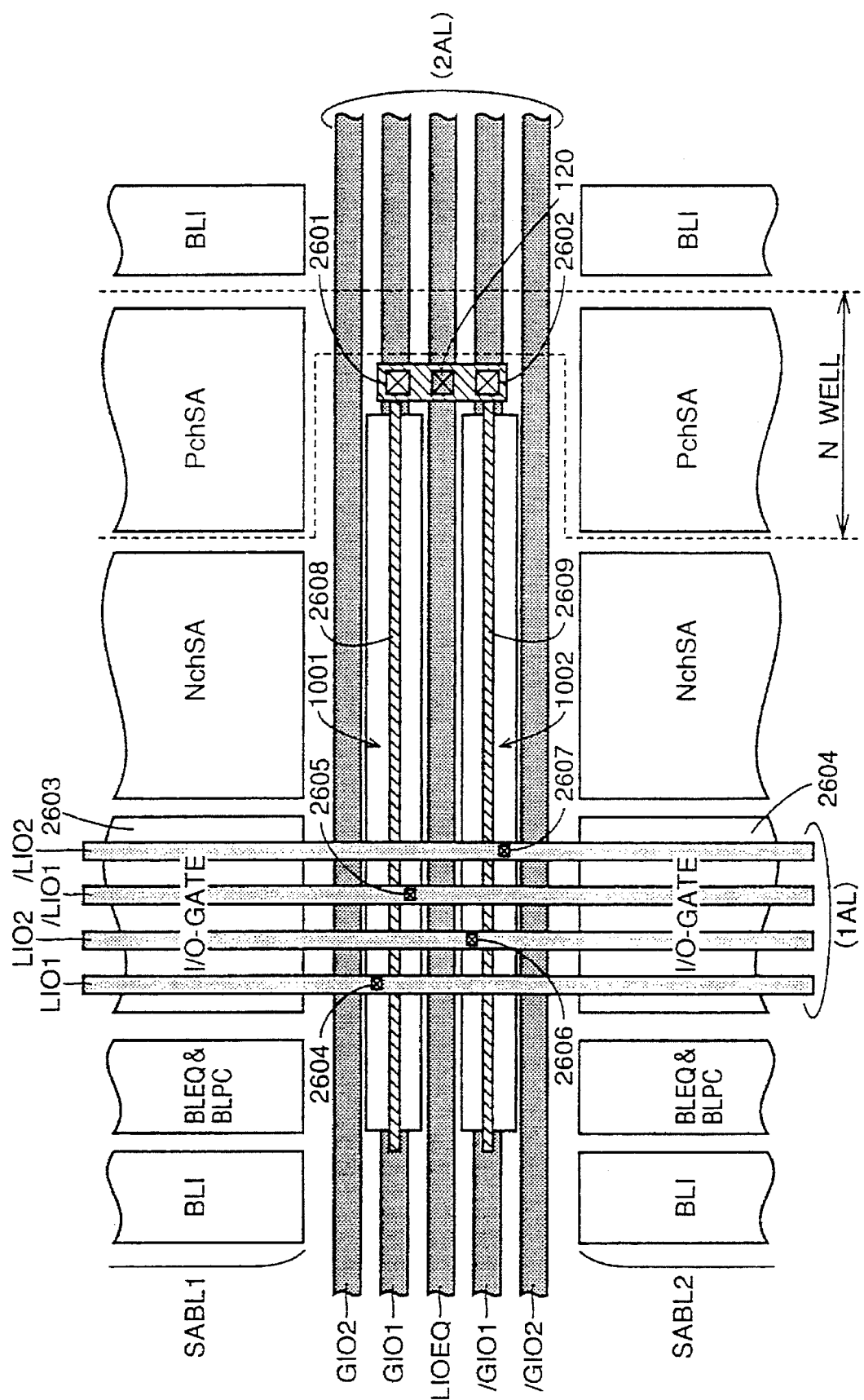
FIG. 26 is a plan view showing a specific structure of the equalizing circuit shown in FIG. 10.

Referring to FIG. 26, an equalizing circuit for two local I/O line pairs LIO1, /LIO1 and LIO2, /LIO2 is arranged corresponding to one shunt region (shunt 2 in FIG. 2). The equalizing circuit includes N channel MOS transistors 1001 and 1002, which are arranged between an I/O gate region 2603 in sense amplifier block SABL1 and sense amplifier block SABL adjacent thereto. The N well for the P channel sense amplifiers is formed continuously without disconnected by the regions below global I/O line pairs GIO1, /GIO1 and BIO2, /GIO2. However, in order to ensure sufficiently large N channel MOS transistors 1001 and 1002, the N well portion in this region is made narrower than other portions.

Further, the source/drain regions of N channel MOS transistors 1001 and 1002 are connected to local I/O line pairs LIO1, /LIO1 and LIO2, /LIO2 through an intermediate layer (not shown) formed in the same layer as the bit lines and through contact holes 2604 to 2607, respectively. Gate electrodes 2608 and 2609 of N channel MOS transistors 1001 and 1002 are connected to LIOEQ line via contact holes 2601 and 2602 as well as through hole 120.

[Second Embodiment]

In the second embodiment, different from FIG. 21, a shared gate driving circuit 2701 is provided corresponding to sense amplifier block b0 at the end of memory array block 2101, and a shared gate driving circuit 2701 is provided corresponding to sense amplifier block portion b32 at the other end of memory array block 2101. Each shared gate driving circuit 2701 includes, as other shared gate driving circuits 2106, an inverter 2702. However, inverter 2702 has its input node grounded, so that inverter 2702 constantly applies the boosted power supply voltage $V_{BP}$ to shared gate 2104. Therefore, each of the sense amplifiers 2103 at the end of the memory array block 2101 is always connected to the corresponding one of the bit line pairs BL, /BL.

According to the second embodiment, since shared gate driving circuits 2106 and 2701 are formed periodically, data read/write characteristics can be made uniform in the overall memory array block 2101.

[Third Embodiment]

Figure 28:
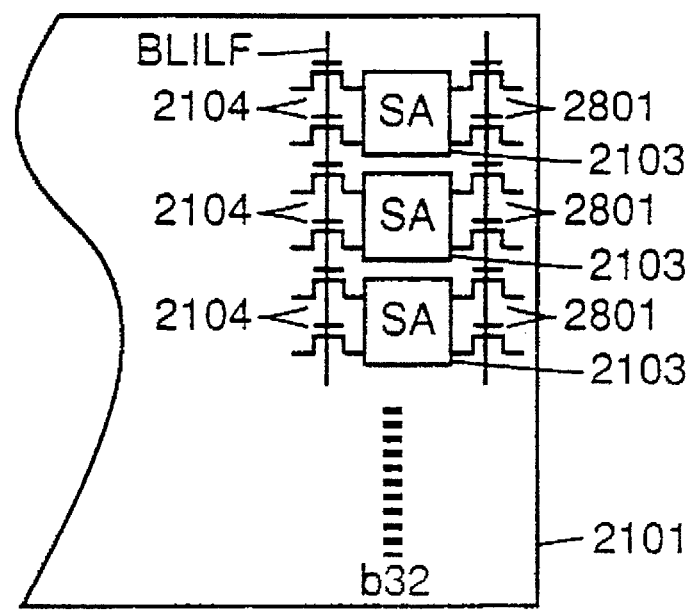
FIG. 28 is a block diagram showing a shared sense amplifier structure in the semiconductor memory device in accordance with the third embodiment of the present invention.

Referring to FIG. 28, there is provided a shared gate 2104 on the left side of the figure of sense amplifier 2103, and additionally, a shared gate 2801 is provided on the right side. Since the sense amplifiers 2103 are arranged on the right end of memory array block 2101, shared gates 2801 need not be provided, in principal, on the right side of the sense amplifiers 2103. However, by the provision of such shared gates 2801, sense amplifiers 2103 at the end portion come to have the same bit line capacitances as the central sense amplifiers. Therefore, operation of all the sense amplifiers in memory array block 2101 will be uniform.

Figure 27:
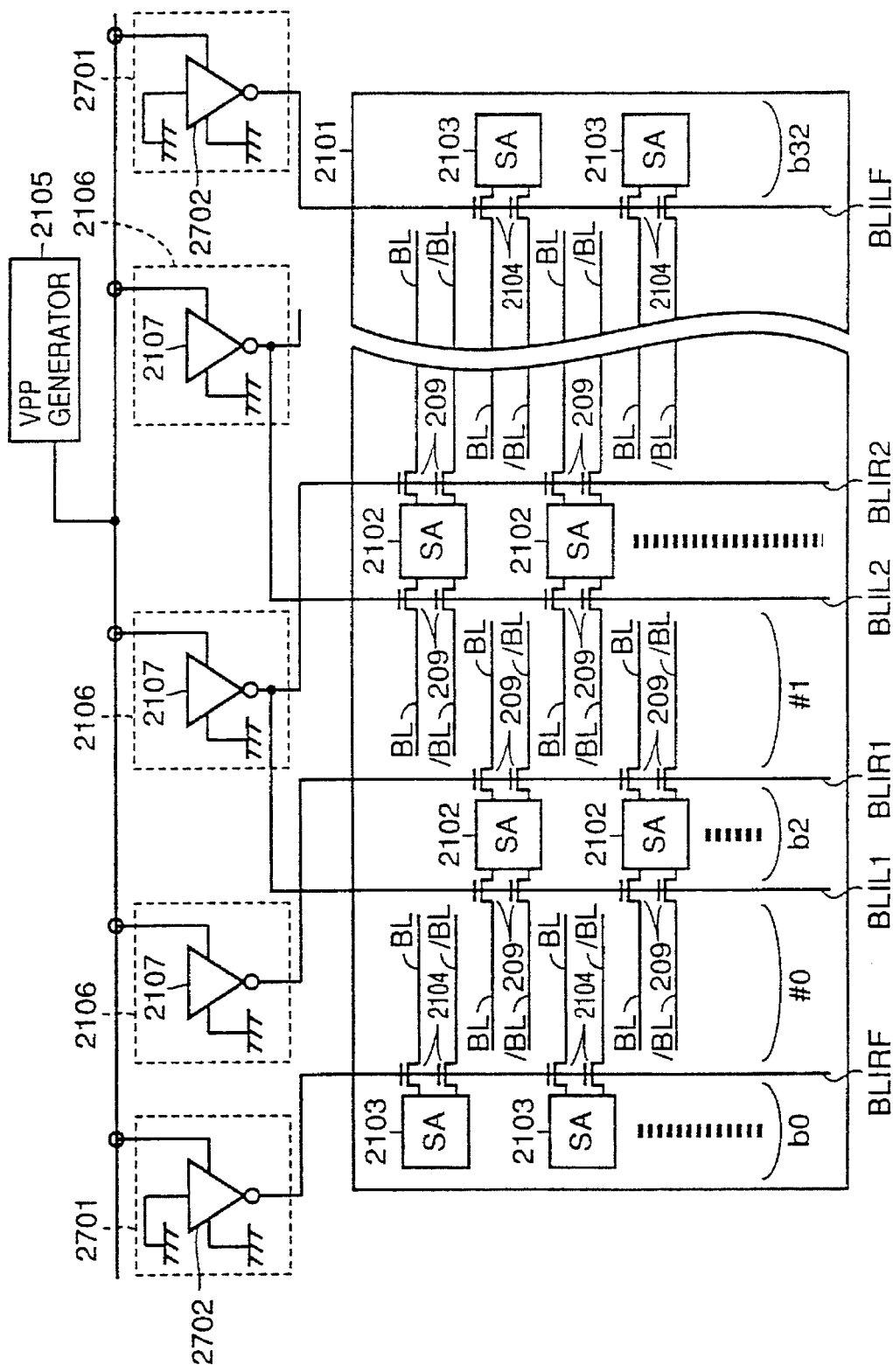
FIG. 27 is a block diagram showing a shared sense amplifier structure in the semiconductor memory device in accordance with a second embodiment of the present invention.

Here, to the shared gate 2104 on the left side of sense amplifier 2103, the boosted power supply voltage VPP may be directly applied as shown in FIG. 21, or, alternatively, a signal at the level of $V_{BP}$ may be constantly applied from shared gate driving circuit 2701, as shown in FIG. 27.

Meanwhile, to the shared gate 2801 on the right side of sense amplifier 2103, the boosted power supply voltage $v_{BP}$ may be directly applied as shown in FIG. 21, or a signal at the level of $V_{BP}$ from shared gate driving circuit 2701 may be applied as shown in FIG. 27. Further, the ground voltage $V_{SS}$ may be directly applied to shared gates 2801, or BLI signal may be applied as other shared gates which are turned on/off in response to selection/non-selection of the block.

[Fourth Embodiment]

Figure 29:
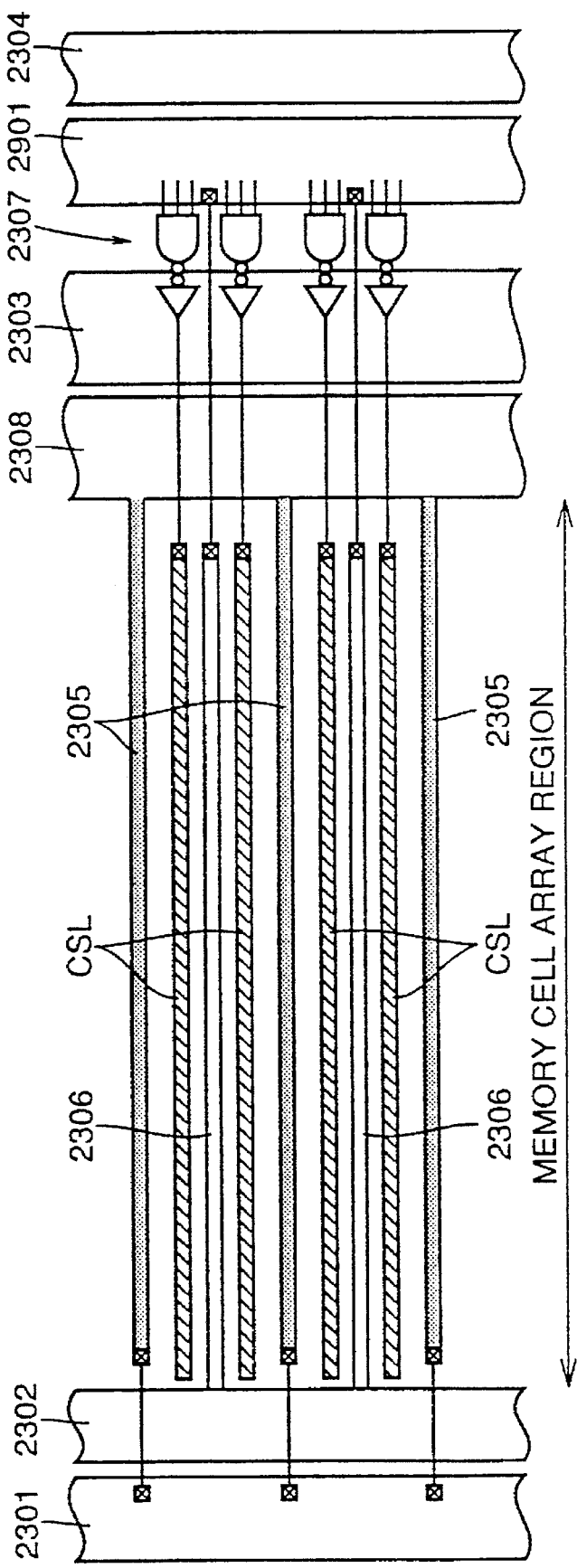
FIG. 29 is a plan view showing arrangements of a memory cell array and power supply and ground lines in the periphery, in the semiconductor memory device in accordance with a fourth embodiment of the present invention.

In the fourth embodiment, different from FIG. 23, a mesh ground line 2901 for supplying the ground voltage $V_{SS}$ of mesh ground line 2309 in the memory array region is formed separate from the ground line 2304 for the column decoder and the column selecting line driver, as shown in FIG. 29. Mesh ground line 2306 in the memory cell array region is connected to a mesh ground line 2302 on the outer periphery of the chip, as well as to mesh ground line 2901 at the center of the chip. Therefore, the ground voltage $V_{SS}$ of mesh ground line 2306 is further reinforced.

[Fifth Embodiment]

Figure 30:
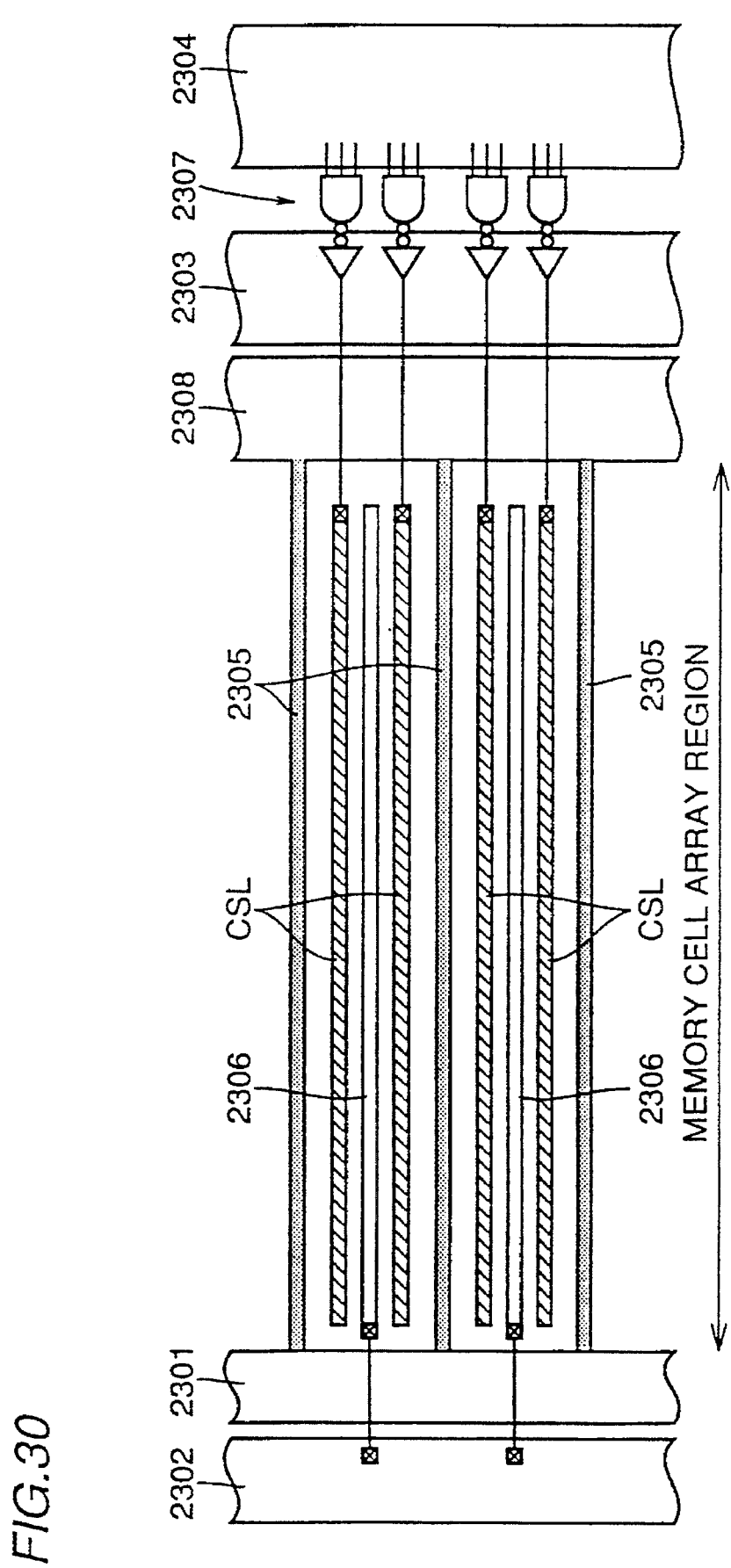
FIG. 30 is a plan view showing arrangement of a memory cell array and power supply and ground lines in the periphery, therearound in the semiconductor memory device in accordance with a fifth embodiment of the present invention.

In the fifth embodiment, as shown in FIG. 30, mesh power supply line 2301 and mesh ground line 2302 at the outer periphery of the chip are arranged reverse to FIG. 23. More specifically, mesh ground line 202 is arranged outer than the mesh power supply line 2301.

[Sixth Embodiment]

Figure 31:
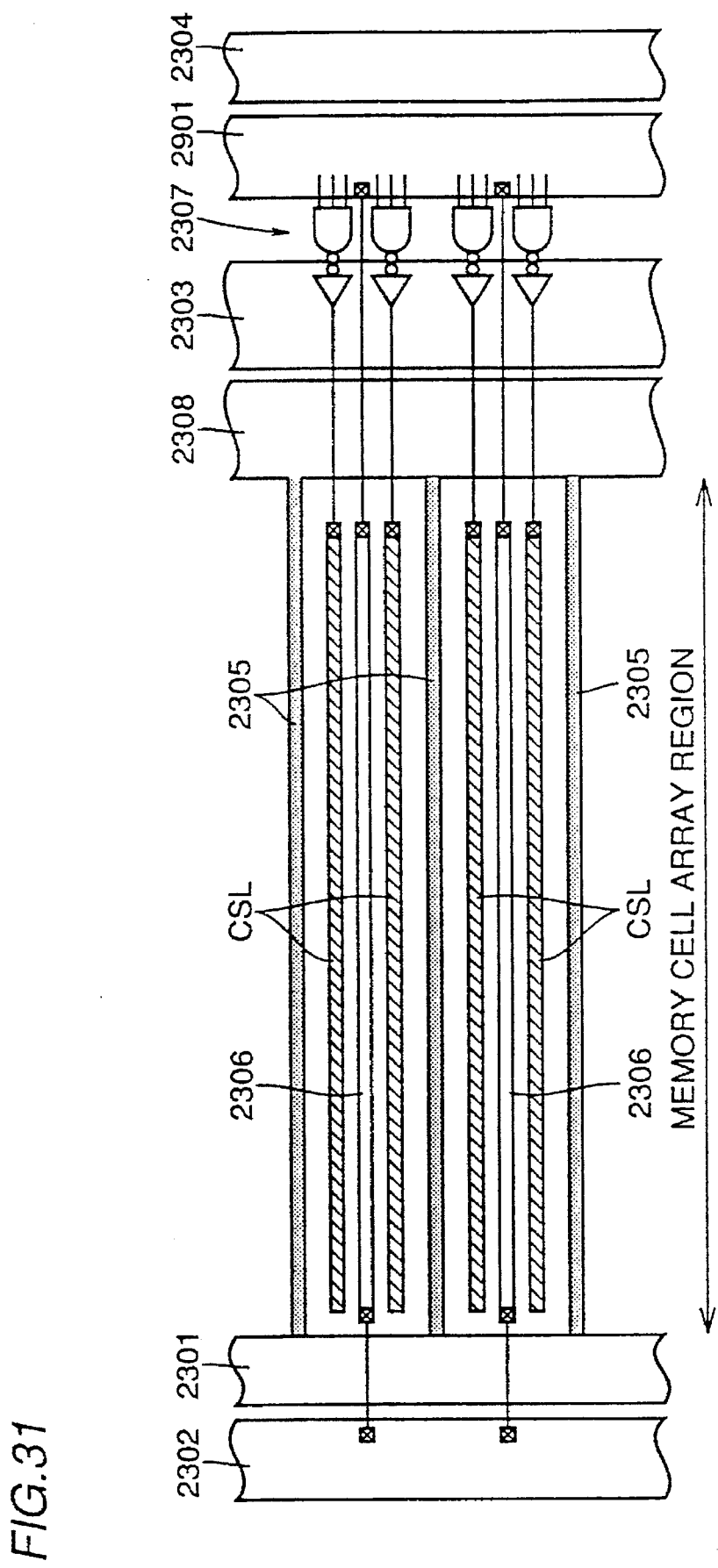
FIG. 31 is a plan view showing an arrangement of a memory cell array and power supply and ground lines in the periphery, in the semiconductor memory device in accordance with a sixth embodiment of the present invention.

Referring to FIG. 31, mesh power supply line 2301 and mesh ground line 2302 are arranged reverse to FIG. 29 in the sixth embodiment. More specifically, mesh ground line 2302 is arranged outer than the mesh power supply line 2301.

[Seventh Embodiment]

Figure 32:
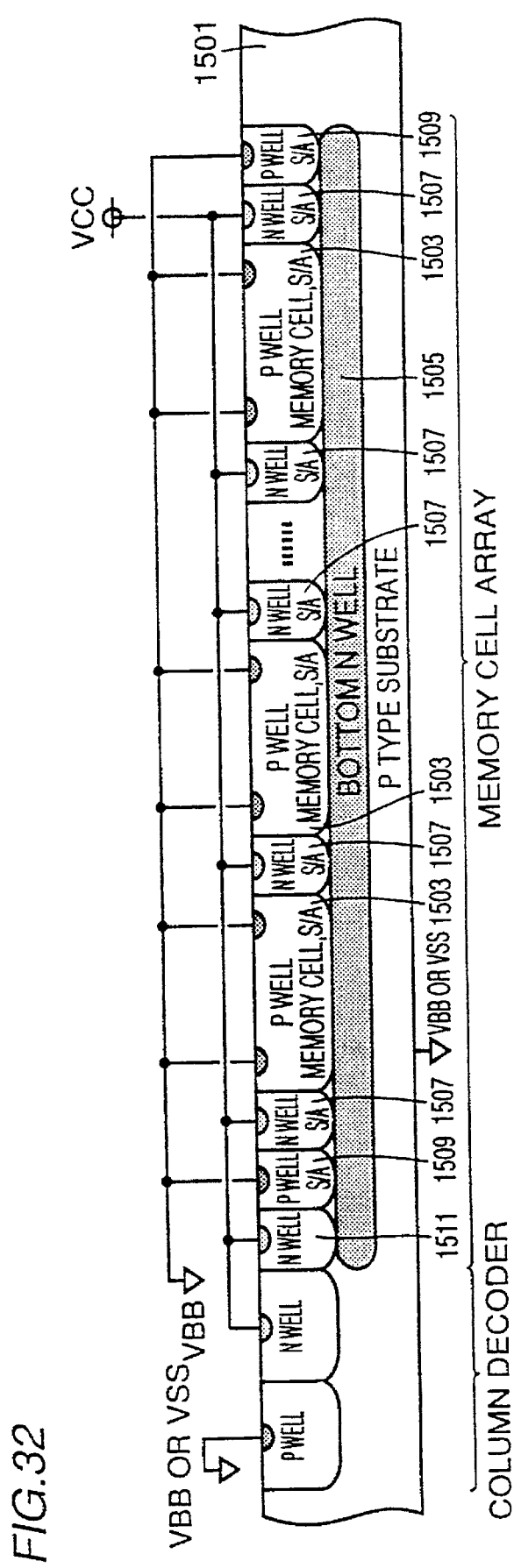
FIGS. 32 and 33 are cross sections taken along the column selecting line, showing the triple well structure of the memory cell array and a column decoder in the semiconductor memory device in accordance with seventh and eighth embodiments of the present invention, respectively.

Referring to FIG. 32, in the seventh embodiment, an N type well 1511 for supplying the power supply voltage Vcc to bottom N well 1505 is formed only on the side of the column decoder.

Since N type well 1511 is formed only on the side of the column decoder and not formed on the outer periphery of the chip, layout area can be reduced as compared with the structure shown in FIG. 16. Further, since power supply voltage Vcc is supplied to bottom N well 1505 not only through N type well 1507 for the sense amplifiers but also through N type well 1511, the voltage at bottom N well 1505 can be stabilized, as compared with the structure shown in FIG. 18.

[Eighth Embodiment]

Figure 33:
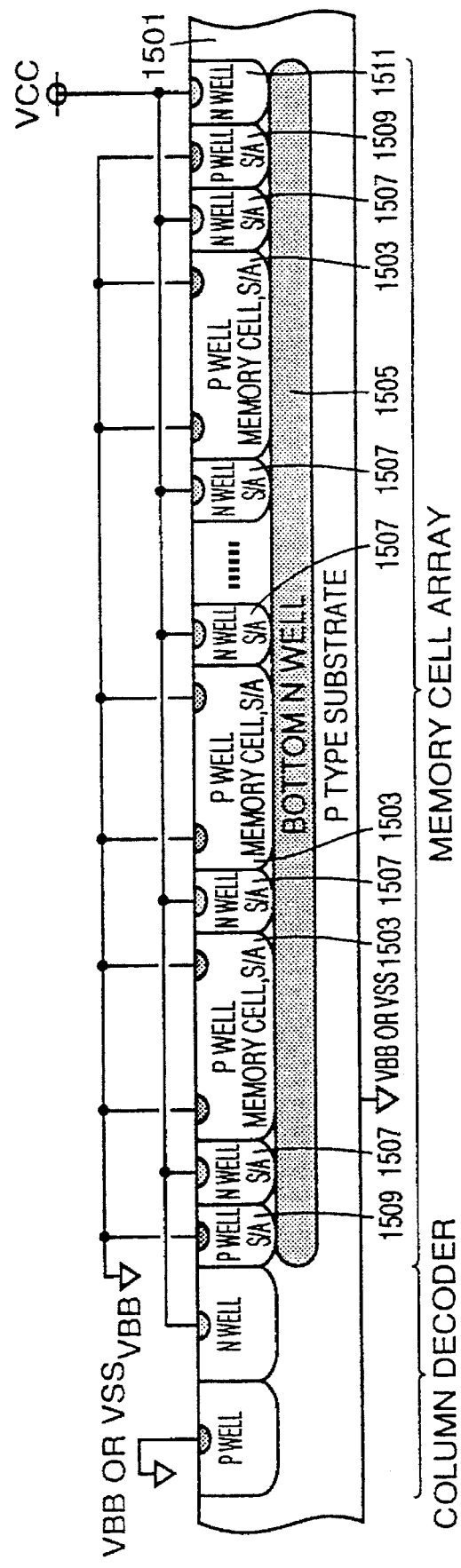

Referring to FIG. 33, in the eighth embodiment, N type well 1511 for supplying power supply voltage Vcc to bottom N well 1505 is formed only on the outer periphery of the chip.

Since N type well 1511 is formed only on the outer periphery of the chip and not formed on the side of the column decoder, layout area can be reduced as compared with the structure shown in FIG. 16. Further, since power supply voltage Vcc is supplied to bottom N well 1505 not only through the N well 1507 for the sense amplifiers but also through n type well 1511, the voltage at bottom N well 1505 can be stabilized as compared with the structure shown in FIG. 18.

[Ninth Embodiment]

Figure 34:
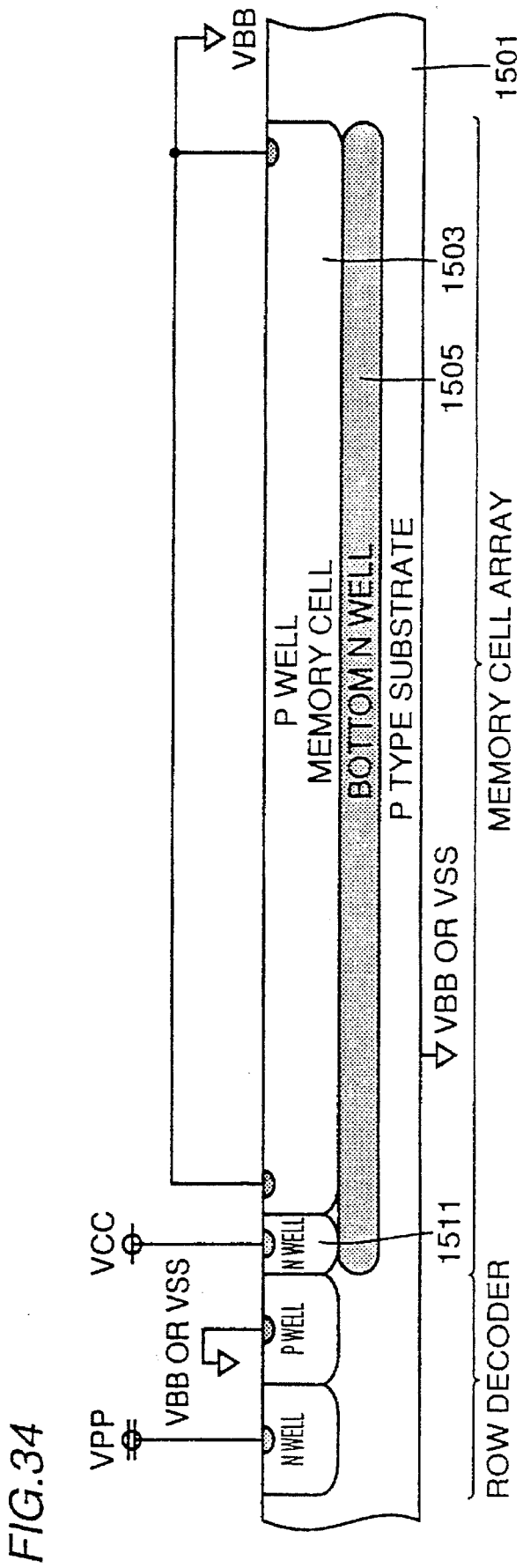
FIGS. 34 and 35 are cross sections taken along the word lines showing the triple well structure of a memory cell array and a row decoder in the semiconductor memory device in accordance with ninth and tenth embodiments of the present invention, respectively.

Referring to FIG. 34, in the ninth embodiment, N type well 1511 for supplying power supply voltage Vcc to bottom N well 1505 is formed only on the side of the row decoder.

Since N type well 1511 is formed only on the side of the row decoder and not on the chip outer periphery, layout area can be reduced as compared with the structure shown in FIG. 17. Further, since power supply voltage Vcc is supplied to bottom N well 1505 not only through N type well 1507 for N channel sense amplifiers but also through N type well 1511, the voltage of bottom N well 1505 can be stabilized as compared with the structure shown in FIG. 19.

[Tenth Embodiment]

Figure 35:
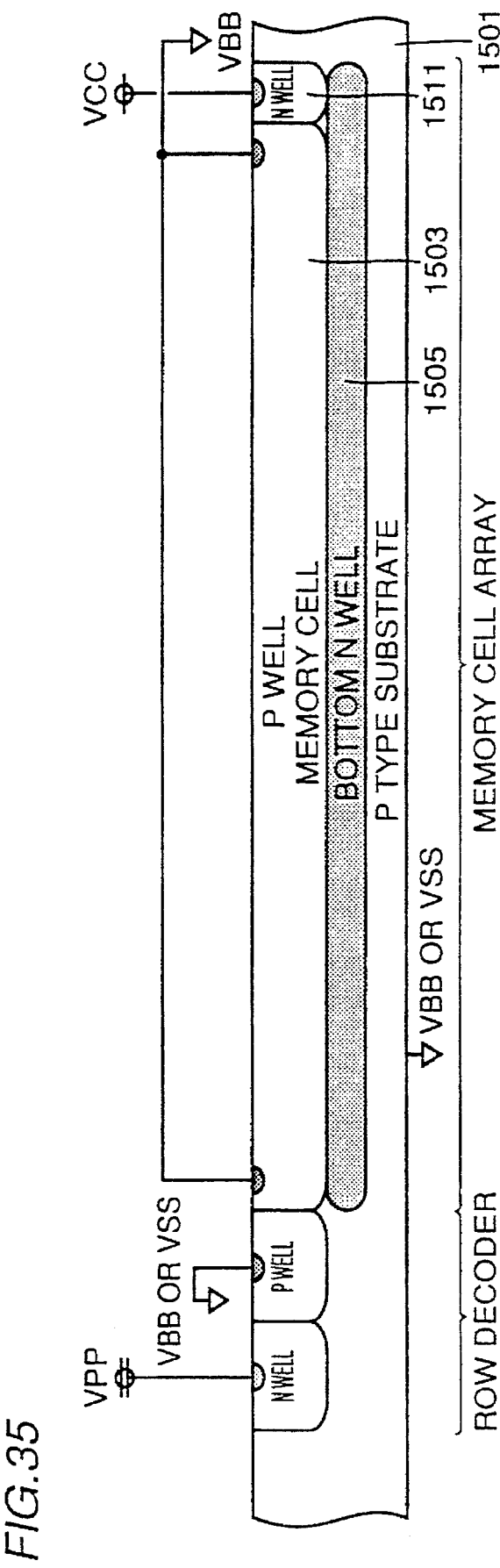

Referring to FIG. 35, in the tenth embodiment, N type well 1511 for supplying power supply voltage Vcc to bottom N well 1505 is formed only on the chip outer periphery.

Since N type well 1511 is formed only on the outer periphery of the chip and not on the side of the row decoder, layout area can be reduced as compared with the structure of FIG. 17. Further, since power supply voltage Vcc is supplied to bottom N well 1505 not only through N type well 1507 for the sense amplifier but also through N type well 1511, the voltage of bottom N well 1505 can be stabilized as compared with the structure shown in FIG. 19.

Alternatively, N type well 1511 may be formed only on the side of the column decoder and the chip outer peripheral side opposing thereto. N type well 1511 may be formed only on the chip outer peripheral side opposing to the column decoder and on the chip outer peripheral side opposing to the row decoder. N type well 1511 may be formed only on the side of the column decoder and the chip outer peripheral side opposing to the row decoder. N type well 1511 may be formed only on the column decoder side, the chip outer peripheral side opposing thereto and on the chip outer peripheral side opposing to the row decoder. N type well 1511 may be formed only on the row decoder side and the chip outer peripheral side opposing to the column decoder. N type well 1511 may be formed only on the column decoder side and the row decoder side. N type well 1511 may be formed only on the column decoder side, the chip outer peripheral side opposing thereto and on the row decoder side. N type well 1511 may be formed only on the row decoder side and the chip outer peripheral side opposing thereto. N type well 1511 may be formed only on the row decoder side and chip outer peripheral side opposing thereto and on the chip outer peripheral side opposing to the column decoder. N type well 1511 may be formed only on the row decoder side, the chip outer peripheral side opposing thereto and the column decoder side.

[Eleventh Embodiment]

Figure 36:
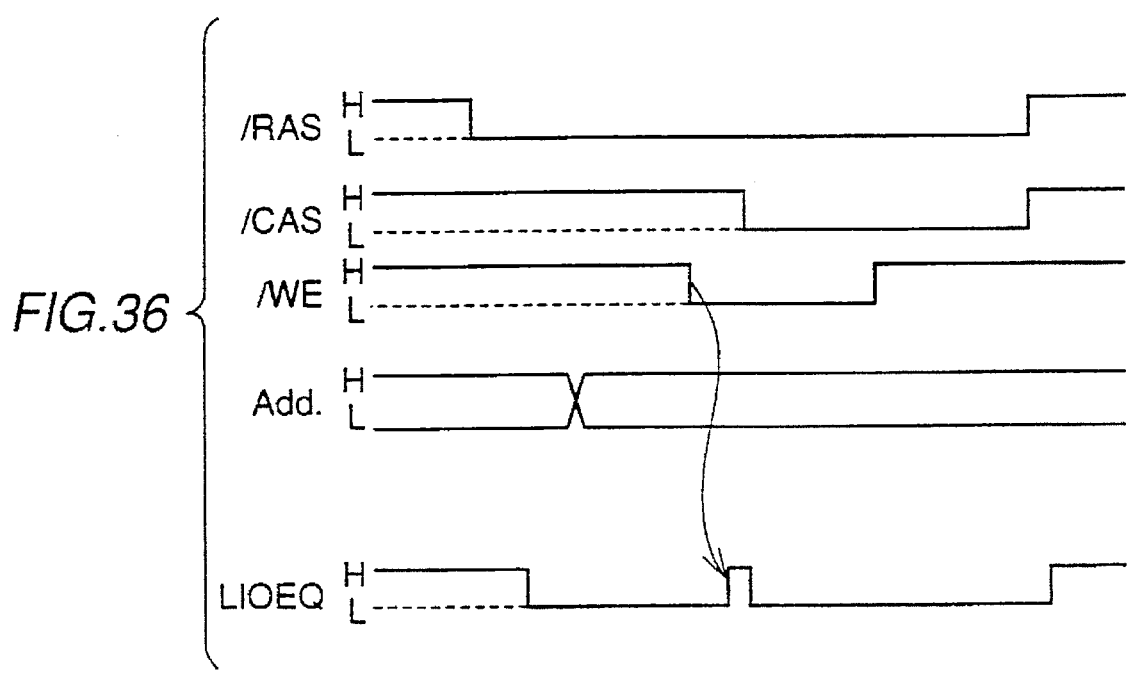
FIGS. 36 to 38 are timing charts showing the operation of the equalizing circuits for the local I/O line pair in the semiconductor memory device in accordance with the eleventh to thirteenth of the present invention, respectively.

Referring to FIG. 36, in the eleventh embodiment, different from FIG. 11, when write enable signal/WE attains to the active L level, that is, when the write cycle is terminated, equalizing signal LIOEQ is activated to the H level, whereby the voltages of the local I/O line pair are equalized.

[Twelfth Embodiment]

Figure 37:
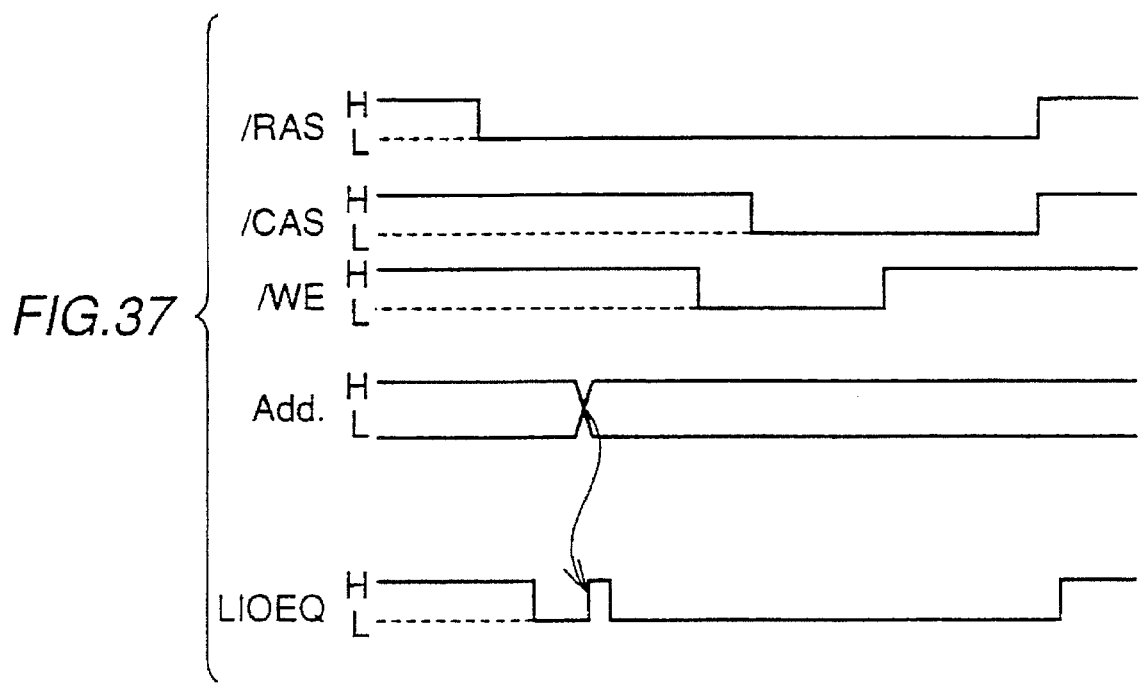

Referring to FIG. 37, in the twelfth embodiment, different from FIG. 11, only when there is a transition of address signal Add after the activation of column enable signal/CE, equalizing signal LIOEQ is activated to the H level, whereby voltages of the local I/O line pair are equalized.

[Thirteenth Embodiment]

Figure 38:
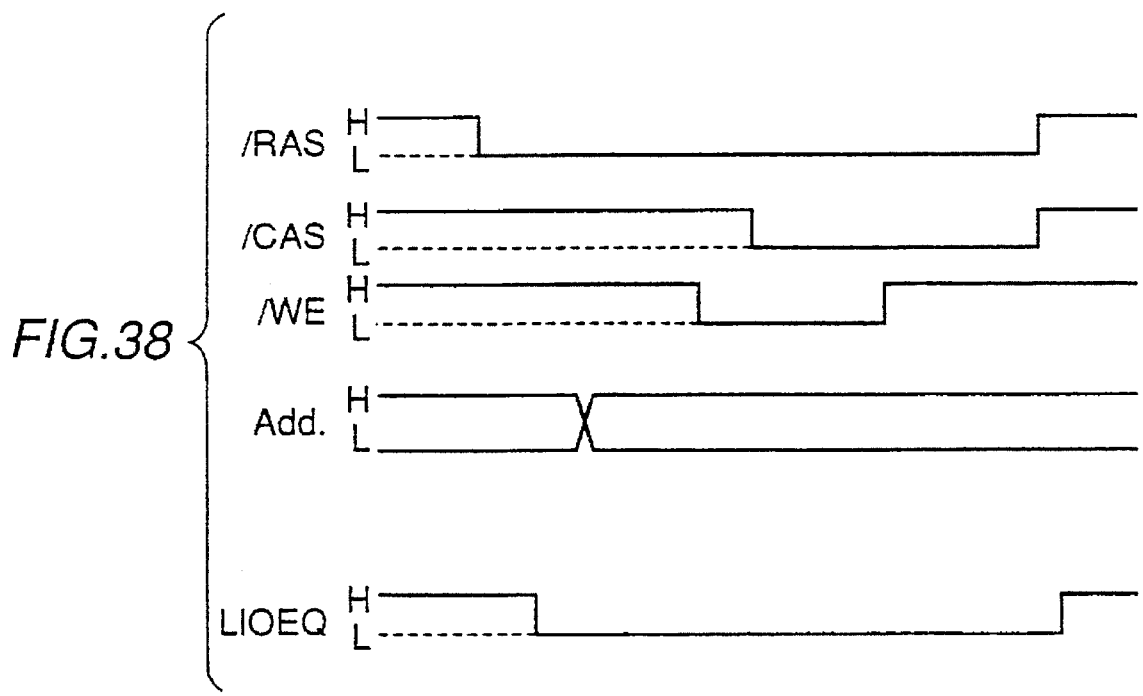

Referring to FIG. 38, in the thirteenth embodiment, different from FIG. 10, not only when there is a transition of address Add after activation of column enable signal/CE but also when write enable signal/WE is activated to the L level, equalizing signal LIOEQ is not activated. Therefore, the equalizing signal LIOEQ is activated in response to inactivation of row address strobe signal/RAS, and inactivated in response to activation of row address strobe signal/RAS. Therefore, voltages of local I/O line pair are equalized only when the chip is inactive.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
 a plurality of first memory blocks arranged in a column direction,
 each of said first memory blocks including
  four second memory blocks arranged in the column direction,
  a plurality of word lines arranged in a row direction traversing said four second memory blocks,
  four shunt regions arranged alternately with said four second memory blocks for shunting said plurality of word lines,
  four column selecting lines arranged in the column direction,
  four local I/O line pairs arranged in the row direction two by two on both sides of said four second memory blocks, and
  four global I/O line pairs arranged in the column direction and each traversing corresponding one of said shunt regions,
 each of said second memory blocks including
  four bit line pairs arranged in the column direction crossing said plurality of word lines,
  a plurality of memory cells arranged at cross points of said plurality of word lines and said four bit line pairs,
  four P channel sense amplifiers connected to corresponding one of said bit line pairs,
  four N channel sense amplifiers connected to corresponding one of said bit line pairs, and
  four column selecting gates turning on in response to corresponding one of said column selecting lines, each being connected between corresponding one of said bit line pairs and corresponding one of said local I/O line pairs,
 each of said first memory blocks further including
  four transmission gates arranged two by two on both sides of said four shunt regions, each being connected between corresponding one of said local I/O line pair and corresponding one of said global I/O line pair, and
  four equalizing circuits arranged two by two on both sides of said four shunt regions for equalizing voltages of said four local I/O line pairs,
  each of said equalizing circuits being arranged on a side opposing to that side on which corresponding one of said transmission gates is arranged.

2. The semiconductor memory device according to claim 1, further comprising:
 a first sense amplifier driving line traversing said plurality of first blocks for driving at least one of said P channel sense amplifiers, and
 a second sense amplifier driving line traversing said plurality of first blocks for driving at least one of said N channel sense amplifiers.

3. The semiconductor memory device according to claim 1, wherein
 at least one of said equalizing circuit equalizes voltages of said first and second sense amplifier driving lines.

4. The semiconductor memory device according to claim 1, wherein
 one of the two equalizing circuits arranged on one side of said four shunt regions equalizes voltages of two local I/O line pairs arranged on corresponding one side of said four second memory blocks at a first time point, and another one of said two equalizing circuits equalizes voltages of said two local I/O line pairs at a second time point different from said first time point.

5. The semiconductor memory device according to claim 1, wherein
 at least one of said equalizing circuits equalizes a corresponding one voltage of said local I/O line pairs after data is written to said memory cell.

6. The semiconductor memory device according to claim 1, wherein
 each of said second memory blocks further include
  a power supply line arranged between at least one of said global I/O line pairs and corresponding one of said column selecting lines.

7. A semiconductor memory device, comprising:
 first and second base blocks arranged in a row direction;
 four first global I/O line pairs arranged in a column direction traversing said first and second base blocks; and
 four second global I/O line pairs arranged in the column direction traversing said first and second base blocks, each extending along corresponding one of said first global I/O line pairs; wherein
 said first base block includes
  four first memory blocks arranged in the column direction, a plurality of first word lines arranged in the row direction traversing said four first memory blocks, four first local I/O line pairs arranged in the row direction, and four first transmission gates each being connected between corresponding one of said first local I/O line pairs and corresponding one of said first global I/O lines;

each of said first memory blocks includes four first bit line pairs arranged in the column direction crossing said plurality of first word lines, a plurality of first memory cells arranged at cross points of said plurality of first word lines and said four first bit line pairs, and four first column selecting gates each being connected between corresponding one of said first bit line pairs and corresponding one of said first local I/O line pairs;

said second base block includes four second memory blocks arranged in the column direction, a plurality of second word lines arranged in the row direction traversing said four second memory blocks, four second local I/O line pairs arranged in the row direction, and four second transmission gates each being connected between corresponding one of said second local I/O line pairs and corresponding one of said second global I/O lines; and each of said second memory blocks includes four second bit line pairs arranged in the column direction crossing said plurality of second word lines, a plurality of second memory cells arranged at cross points of said plurality of second word lines and said four second bit line pairs, and four second column selecting gates each being connected between corresponding one of said second bit line pairs and corresponding one of said second local I/O line pairs.

8. A semiconductor memory device, comprising:

a plurality of first word lines arranged in a row direction;

a first bit line pair crossing said plurality of first word lines;

a plurality of first memory cells arranged at cross points of said plurality of first word lines and said first bit line pair;

a first local I/O line pair corresponding to said first bit line pair;

a first column selecting gate connected between said first bit line pair and said first local I/O line pair;

a first global I/O line pair corresponding to said first local I/O line pair;

a first transmission gate connected between said first local I/O line pair and said first global I/O line pair;

a plurality of second word lines arranged in the row directions;

a second bit line pair crossing said plurality of second word lines;

a plurality of second memory cells arranged at cross points of said plurality of second word lines and said second bit line pairs;

a second local I/O line pair corresponding to said second bit line pair;

a second column selecting gate connected between said second bit line pair and said second local I/O line pair;

a second global I/O line pair corresponding to said second local I/O line pair and extending along said first global I/O line pair;

a second transmission gate connected between said second local I/O line pair and said second global I/O line pair; and a prescribed line extending along said first and second global I/O line pair; wherein one and the other global I/O lines of said first global I/O line pair are arranged on both sides of said prescribed line, and one and the other global I/O lines of said second global I/O line pair are arranged on both sides of said first global I/O line pair.

* * * * *